US012700450B2

(12) United States Patent
Jang et al.

(10) Patent No.: US 12,700,450 B2
(45) Date of Patent: Aug. 4, 2026

(54) OFFSET COMPENSATED SENSE AMPLIFIER AND MEMORY DEVICES INCLUDING THE SAME

(71) Applicant: SAMSUNG ELECTRONICS CO., LTD., Suwon-si (KR)

(72) Inventors: Miji Jang, Suwon-si (KR); Kyuseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 128 days.

(21) Appl. No.: 18/905,764

(22) Filed: Oct. 3, 2024

(65) Prior Publication Data

US 2025/0124970 A1    Apr. 17, 2025

(30) Foreign Application Priority Data

Oct. 17, 2023    (KR) ......................... 10-2023-0138857

(51) Int. Cl.
G11C 11/4091 (2006.01)
G11C 11/4074 (2006.01)
G11C 11/4094 (2006.01)

(52) U.S. Cl.
CPC ...... G11C 11/4091 (2013.01); G11C 11/4074 (2013.01); G11C 11/4094 (2013.01)

(58) Field of Classification Search
CPC ................................................ G11C 11/4091
See application file for complete search history.

(56) References Cited

U.S. PATENT DOCUMENTS

| | | | |
|---|---|---|---|
| 10,586,586 B1 | 3/2020 | Lee et al. | |
| 10,839,873 B1 | 11/2020 | Lee | |
| 10,943,644 B1 | 3/2021 | Lee | |
| 11,087,805 B2 | 8/2021 | Lee | |
| 11,152,055 B1 | 10/2021 | Lee | |
| 11,170,841 B2 | 11/2021 | He et al. | |
| 11,289,151 B2 | 3/2022 | Nagata | |
| 11,380,371 B2 | 7/2022 | Lin et al. | |
| 2022/0270653 A1 | 8/2022 | Cao et al. | |
| 2022/0270654 A1 | 8/2022 | Lam et al. | |
| 2022/0310134 A1 | 9/2022 | Su | |
| 2023/0013417 A1 | 1/2023 | Sato et al. | |
| 2023/0230630 A1* | 7/2023 | Yang ..................... | H10B 12/50 |
| | | | 365/149 |

* cited by examiner

*Primary Examiner* — Jason Lappas
(74) *Attorney, Agent, or Firm* — Sughrue Mion, PLLC

(57) ABSTRACT

An offset compensated sense amplifier and a memory device including the same are disclosed. A sense amplifier for sensing and amplifying data stored in a memory cell includes a first sense amplifier circuit including first and second PMOS transistors connected to a first sensing driving signal line and a second sense amplifier circuit including first and second NMOS transistors connected to a second sensing driving signal line. The sense amplifier the sense amplifier is configured to perform an offset compensation operation before sensing and amplifying the data stored in the memory cell, the offset compensation operation including a first offset compensation operation based on a threshold voltage difference between the first NMOS transistor and the second NMOS transistor, and a second offset compensation operation based on a threshold voltage difference between the first PMOS transistor and the second PMOS transistor.

20 Claims, 22 Drawing Sheets

100

100

OFFSET COMPENSATED SENSE AMPLIFIER AND MEMORY DEVICES INCLUDING THE SAME

CROSS-REFERENCE TO RELATED APPLICATION

This application claims priority to Korean Patent Application No. 10-2023-0138857, filed on Oct. 17, 2023, in the Korean Intellectual Property Office, the disclosure of which is incorporated by reference herein in its entirety.

BACKGROUND

The present disclosure relates to a semiconductor memory device, and more particularly, to an offset compensated sense amplifier and memory devices including the same.

Dynamic random access memory (DRAM) operates by writing and reading data using charges stored in a cell capacitor of a memory cell. In DRAM, a memory cell array is connected to bit lines and complementary bit lines. When a read or refresh operation is performed, a sense amplifier senses and amplifies the voltage difference of a bit line and a complementary bit line. Semiconductor devices constituting the sense amplifier may have different inter-device characteristics, e.g., different threshold voltages, due to a process variation, a temperature, and the like. The different inter-device characteristics may cause offset noise of the sense amplifier. Due to the offset noise of the sense amplifier, the sensing margin of the sense amplifier may decrease, thereby decreasing accuracy and degrading the performance of the DRAM.

SUMMARY

One or more embodiments provide an offset compensated sense amplifier and memory devices including the same.

According to an aspect of an embodiment, a sense amplifier for sensing and amplifying data stored in a memory cell includes: a first sense amplifier circuit including a first positive-channel metal oxide semiconductor (PMOS) transistor connected between a first sensing driving signal line and an internal node, and a second PMOS transistor connected between the first sensing driving signal line and a complementary internal node; a second sense amplifier circuit including a first negative-channel metal oxide semiconductor (NMOS) transistor connected between a second sensing driving signal line and a bit line, and a second NMOS transistor connected between the second sensing driving signal line and a complementary bit line; an isolation circuit connected between the first sense amplifier circuit and the second sense amplifier circuit, and configured to, according to an isolation signal, selectively connect the internal node to the bit line and selectively connect the complementary internal node to the complementary bit line; and an equalization circuit configured to selectively connect the internal node to the complementary internal node according to a bit line equalizing signal and selectively connect an equalizing driving signal line to the complementary internal node according to an equalizing signal. The sense amplifier is configured to perform an offset compensation operation before sensing and amplifying the data stored in the memory cell, and the offset compensation operation includes a first offset compensation operation based on a threshold voltage difference between the first NMOS transistor and the second NMOS transistor, and a second offset compensation operation based on a threshold voltage difference between the first PMOS transistor and the second PMOS transistor.

According to another aspect of an embodiment, a method of operating a memory device to sense and amplify data stored in a memory cell includes: generating a first bit line precharge voltage, a second bit line precharge voltage higher than the first bit line precharge voltage, a third bit line precharge voltage lower than the first bit line precharge voltage, a first internal power source voltage, and a second internal power source voltage different from the first internal power source voltage by using a power source voltage of the memory device; providing an isolation signal, a bit line equalizing signal, and an equalizing signal to a sense amplifier based on a command received by the memory device, the sense amplifier including a first sense amplifier circuit which includes a first PMOS and a second PMOS transistor connected to a first sensing driving signal line, and a second sense amplifier circuit which includes a first NMOS transistor and a second NMOS transistor connected to a second sensing driving signal line; performing an offset compensation operation using the first internal power source voltage to control a threshold voltage difference between a bit line and a complementary bit line, the offset compensation operation including a first offset compensation operation based on a threshold voltage difference between the first NMOS transistor and the second NMOS transistor, and a second offset compensation operation based on a threshold voltage difference between the first PMOS transistor and the second PMOS transistor; performing a charge sharing operation based on charges stored in the memory cell while controlling the first sensing driving signal line and the second sensing driving signal line to float after performing the offset compensation operation; and performing a sensing operation based on voltage levels of the bit line and the complementary bit line while providing the second internal power source voltage to the first sensing driving signal line and a ground voltage to the second sensing driving signal line, after performing the charge sharing operation.

According to another aspect of an embodiment, a memory device includes: a sense amplifier configured to sense and amplify data stored in a memory cell; a voltage generation circuit configured to generate a first bit line precharge voltage, a second bit line precharge voltage higher than the first bit line precharge voltage, and an internal power source voltage by using a power source voltage of the memory device; and a control circuit configured to generate an isolation signal, a bit line equalizing signal, and an equalizing signal based on a command received by the memory device, and selectively provide the first bit line precharge voltage, the second bit line precharge voltage and the internal power source voltage to the sense amplifier. The sense amplifier includes: a first sense amplifier circuit including a first PMOS transistor connected between a first sensing driving signal line and an internal node, and a second PMOS transistor connected between the first sensing driving signal line and a complementary internal node; a second sense amplifier circuit including a first NMOS transistor connected between a second sensing driving signal line and a bit line and a second NMOS transistor connected between the second sensing driving signal line and a complementary bit line; an isolation circuit connected between the first sense amplifier circuit and the second sense amplifier circuit and configured to, according to the isolation signal, selectively connect the internal node to the bit line and selectively connect the complementary internal node to the complementary bit line; and an equalization circuit configured to connect the internal node to the complementary internal node according to the bit line equalizing signal and selectively connect an equalizing driving signal line to the complementary internal node according to the equalizing signal. The sense amplifier is configured to perform an offset compensation operation before sensing and amplifying the data stored in the memory cell, and the offset compensation operation is performed such that a threshold voltage difference occurs between the bit line and the complementary bit line, and includes a first offset compensation operation based on a threshold voltage difference between the first NMOS transistor and the second NMOS transistor, and a second offset compensation operation based on a threshold voltage difference between the first PMOS transistor and the second PMOS transistor.

BRIEF DESCRIPTION OF DRAWINGS

The above and other aspects will be more apparent from the following description of embodiments taken in conjunction with the accompanying drawings, in which.

DETAILED DESCRIPTION

Hereinafter, embodiments will be described in detail with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1:
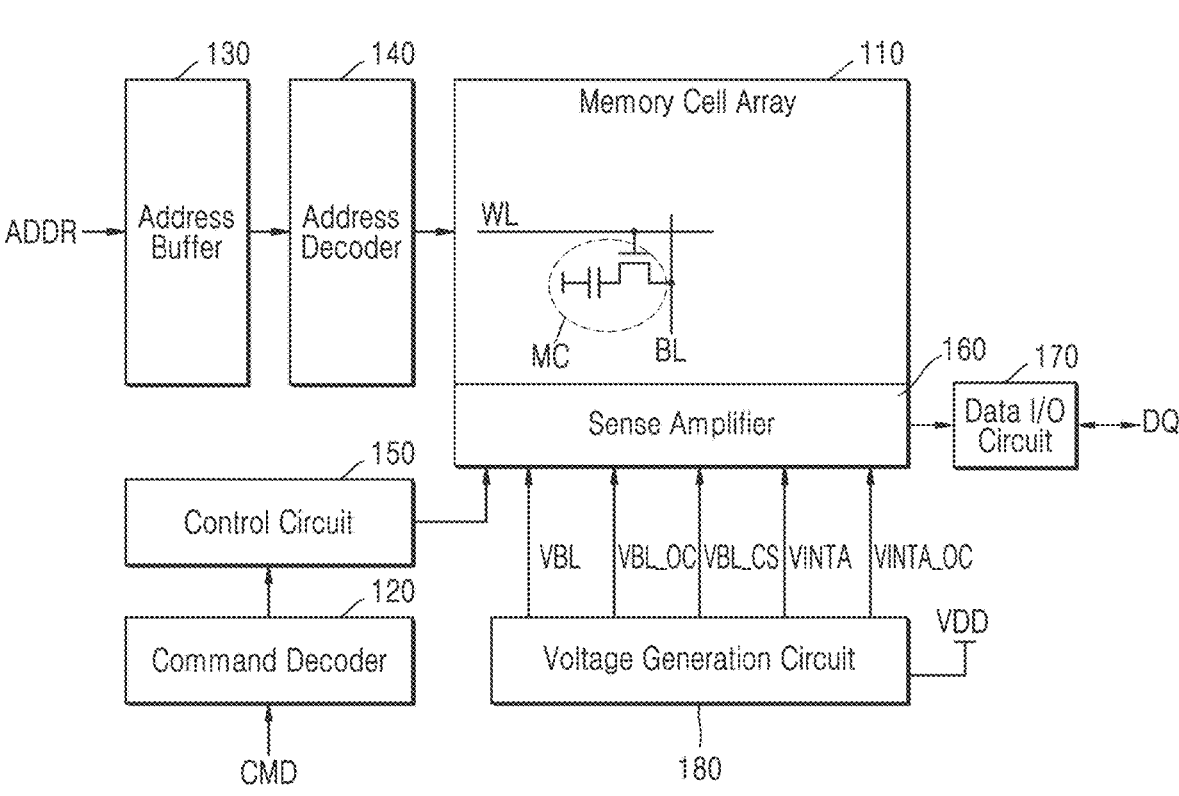
FIG. 1 illustrates a memory device according to embodiments.
Figure 2:
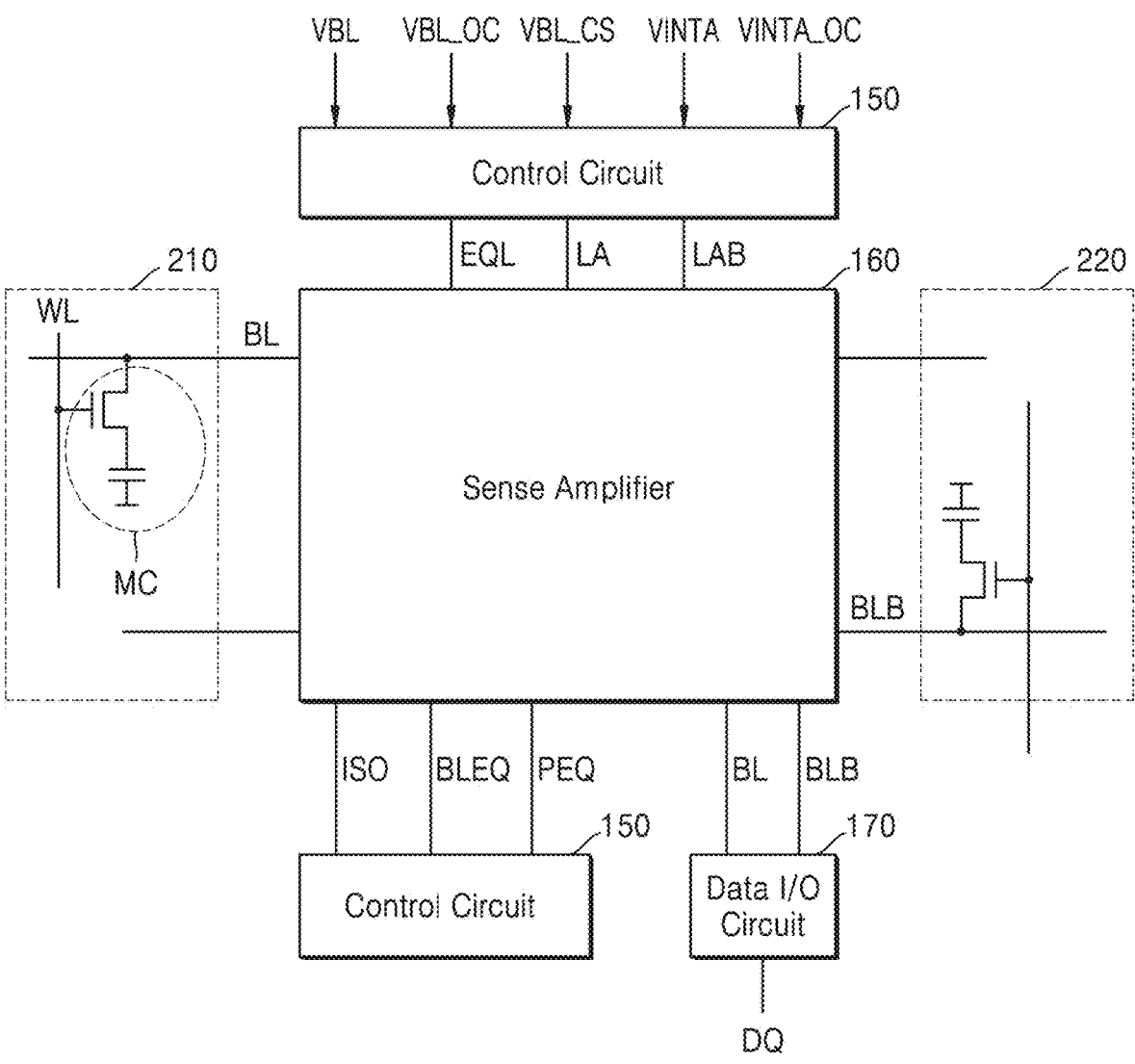
FIGS. 2 and 3 illustrate a sense amplifier of FIG. 1.
Figure 3:
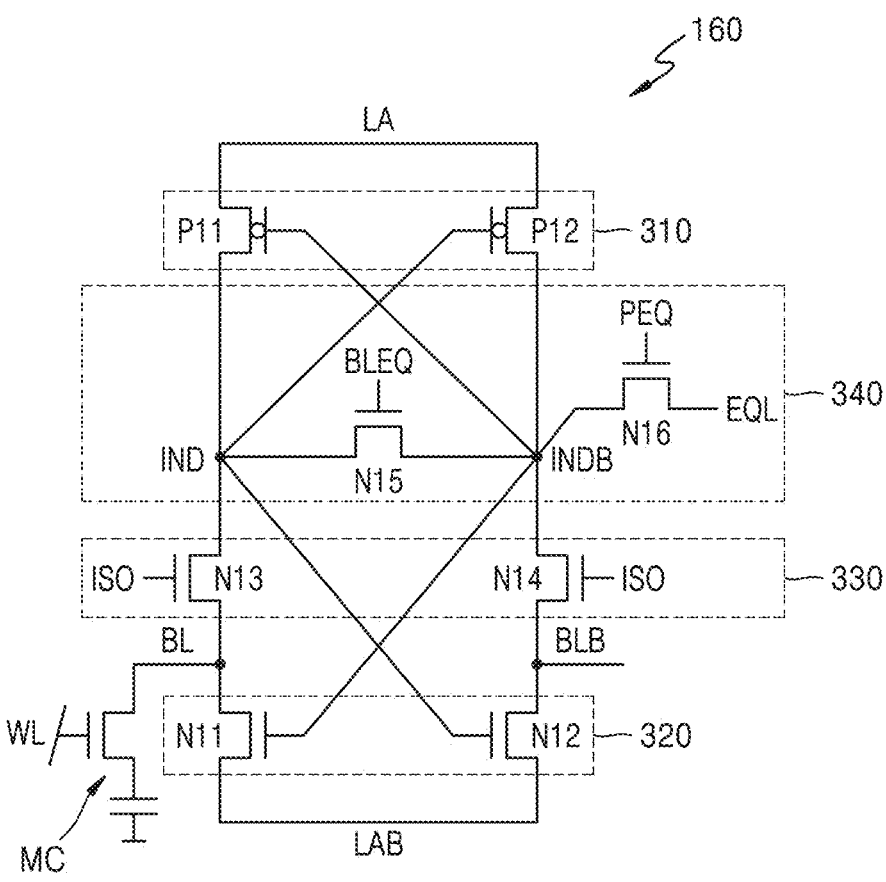

FIG. 1 illustrates a memory device 100 according to embodiments. FIGS. 2 and 3 illustrate a sense amplifier 160 of FIG. 1.

Referring to FIG. 1, the memory device 100 may be implemented by dynamic random access memory (DRAM) configured to sense and amplify a data state stored in a memory cell MC. The memory device 100 may be implemented by, for example, synchronous DRAM (SDRAM), double data rate SDRAM (DDR SDRAM), low power double data rate SDRAM (LPDDR SDRAM), graphics double data rate SDRAM (GDDR SDRAM), wide input/output (I/O) DRAM, high bandwidth memory (HBM), hybrid memory cube (HMC), or the like.

The memory device 100 may input or output data DQ thereto or therefrom according to a command CMD and an address ADDR provided from an external device, e.g., a central processing unit (CPU) or a memory controller. The memory device 100 may include a memory cell array 110, a command decoder 120 (i.e., a command decoder circuit), an address buffer 130 (i.e., an address buffer circuit), an address decoder 140 (i.e., an address decoder circuit), a control circuit 150, the sense amplifier 160 (i.e., a sense amplifier circuit), a data I/O circuit 170, and a voltage generation circuit 180.

The memory cell array 110 may include a plurality of word lines WL, a plurality of bit lines BL, and a plurality of memory cells MC arranged at points of intersection of the plurality of word lines WL and the plurality of bit lines BL. Each memory cell MC may include a cell transistor and, nj9a cell capacitor. The gate of the cell transistor is connected to one of the plurality of word lines WL arranged in the row direction of the memory cell array 110. One end of the cell transistor is connected to one of the plurality of bit lines BL arranged in the column direction of the memory cell array 110. The other end of the cell transistor is connected to the cell capacitor. The cell capacitor may store charges of a capacity corresponding to a data state.

The command decoder 120 may determine the command CMD that is input to the command decoder 120, by referring to operands (variables, fields, or values indicating particular aspects of a command) provided to the memory device 100. The command decoder 120 may be configured to perform internal operations corresponding to the command CMD. The command CMD may include an active command, a read command, a write command, a precharge command, or the like.

The address buffer 130 may receive the address ADDR provided to the memory device 100. The address ADDR may include a row address addressing a word line WL of the memory cell array 110 and a column address addressing a bit line BL of the memory cell array 110. The address buffer 130 may transmit each of the row address and the column address to the address decoder 140.

The address decoder 140 may include a row decoder and a column decoder configured to respectively select the word line WL and the bit line BL of the memory cell MC to be accessed, according to the received address ADDR. The row decoder may decode the row address and enable or activate the word line WL of the memory cell MC corresponding to the row address. The column decoder may decode the column address and provide a column select signal for selecting the bit line BL of the memory cell MC corresponding to the column address.

The control circuit 150 may generate internal control signals and control the sense amplifier 160, according to the command CMD of the command decoder 120. When the sense amplifier 160 senses and amplifies the data state of the memory cell MC, the control circuit 150 may control the sense amplifier 160 to sequentially perform an offset compensation operation, a charge sharing operation, a sensing operation, and a precharging operation. The data sensed and amplified by the sense amplifier 160 may be transmitted to the data I/O circuit 170 configured to output the data to a device outside the memory device 100 through data DQ pad(s).

The data I/O circuit 170 may transmit the data DQ to be written on memory cells MC from an external device and transmit the received data DQ to the memory cell array 110. The data I/O circuit 170 may output, as read data, the data sensed and amplified by the sense amplifier 160 to an external device through the data DQ pad(s).

The voltage generation circuit 180 may generate a first bit line precharge voltage VBL, a second bit line precharge voltage VBL_OC, a third bit line precharge voltage VBL_CS, a first internal power source voltage VINTA, and a second internal power source voltage VINTA_OC to be provided to the sense amplifier 160, by using a power source voltage VDD of the memory device 100.

In some embodiments, the level of the second bit line precharge voltage VBL_OC may be set to be higher than the level of the first bit line precharge voltage VBL and the level of the third bit line precharge voltage VBL_CS may be set to be lower than the level of the first bit line precharge voltage VBL. The level of the first internal power source voltage VINTA may be set to be the same as or different from the level of the second internal power source voltage VINTA_OC. Each of the first bit line precharge voltage VBL, the second bit line precharge voltage VBL_OC, the third bit line precharge voltage VBL_CS, the first internal power source voltage VINTA, and the second internal power source voltage VINTA_OC generated by the voltage generation circuit 180 may be used for operations performed by the sense amplifier 160 according to control by the control circuit 150.

Referring to FIG. 2, the sense amplifier 160 may be constructed by an open bit line structure and connected to the memory cell MC. The open bit line structure is a structure in which a bit line BL and a complementary bit line BLB of a bit line pair are separately located in different adjacent memory cell blocks 210 and 220, respectively. In the open bit line structure, if the word line WL of the selected memory cell MC is enabled, data of the memory cell MC may be read or written through the selected bit line BL. In this case, the complementary bit line BLB may act as a reference for the sense amplifier 160. Accordingly, the sense amplifier 160 may amplify the data of the memory cell MC by using charge-shared charges indicating that the voltage of the bit line BL slightly increases or decreases.

The sense amplifier 160 may be driven by a voltage provided through a first sensing driving signal line LA, a second sensing driving signal line LAB, and/or an equalizing driving signal line EQL. The control circuit 150 may provide the first bit line precharge voltage VBL, the second bit line precharge voltage VBL_OC, the third bit line precharge voltage VBL_CS, the first internal power source voltage VINTA, and the second internal power source voltage VINTA_OC generated by the voltage generation circuit 180 through the first sensing driving signal line LA, the second sensing driving signal line LAB, and the equalizing driving signal line EQL. For example, the first bit line precharge voltage VBL, the second bit line precharge voltage VBL_OC, and the third bit line precharge voltage VBL_CS may be provided through the equalizing driving signal line EQL and the first internal power source voltage VINTA and the second internal power source voltage VINTA_OC may be provided through the first sensing driving signal line LA and/or the second sensing driving signal line LAB.

The sense amplifier 160 may sequentially perform the offset compensation operation, the charge sharing operation, the sensing operation, and the precharging operation according to an isolation signal ISO, a bit line equalizing signal BLEQ, and/or an equalizing signal PEQ. The control circuit 150 may provide the isolation signal ISO, the bit line equalizing signal BLEQ, and/or the equalizing signal PEQ to the sense amplifier 160 during sequential access operations to the selected memory cell MC.

Referring to FIG. 3, the sense amplifier 160 may include a P-type sense amplifier circuit 310 including positive-channel metal oxide semiconductor (PMOS) transistors, and an N-type sense amplifier circuit 320, an isolation circuit 330, and an equalization circuit 340 including negative-channel metal oxide semiconductor (NMOS) transistors. FIG. 3 shows that the P-type sense amplifier circuit 310, the N-type sense amplifier circuit 320, the isolation circuit 330, and the equalization circuit 340 may be functionally and logically separated, but this does not mean that the P-type sense amplifier circuit 310, the N-type sense amplifier circuit 320, the isolation circuit 330, and the equalization circuit 340 are separate physical components. For convenience of description, the P-type sense amplifier circuit 310 may be referred to as a first sense amplifier circuit and the term "P-type sense amplifier circuit 310" and the term "first sense amplifier circuit" may be interchangeably used. The N-type sense amplifier circuit 320 may be referred to as a second sense amplifier circuit and the term "N-type sense amplifier circuit 310" and the term "second sense amplifier circuit" may be interchangeably used.

The P-type sense amplifier circuit 310 may include a first PMOS transistor P11 and a second PMOS transistor P12 connected to the first sensing driving signal line LA. The first PMOS transistor P11 may be connected between the first sensing driving signal line LA and an internal node IND, and the second PMOS transistor P12 may be connected between the first sensing driving signal line LA and a complementary internal node INDB. The complementary internal node INDB may be connected to the gate of the first PMOS transistor P11, and the internal node IND may be connected to the gate of the second PMOS transistor P12. The first PMOS transistor P11 and the second PMOS transistor P12 may be designed to have the same size. In some embodiments, the first PMOS transistor P11 and the second PMOS transistor P12 may be designed to have different sizes.

The N-type sense amplifier circuit 320 may include a first NMOS transistor N11 and a second NMOS transistor N12 connected to the second sensing driving signal line LAB. The first NMOS transistor N11 may be connected between the second sensing driving signal line LAB and the bit line BL, and the second NMOS transistor N12 may be connected between the second sensing driving signal line LAB and the complementary bit line BLB. The complementary internal node INDB may be connected to the gate of the first NMOS transistor N11, and the internal node IND may be connected to the gate of the second NMOS transistor N12. The first NMOS transistor N11 and the second NMOS transistor N12 may be designed to have the same size. In some embodiments, the first NMOS transistor N11 and the second NMOS transistor N12 may be designed to have different sizes.

The isolation circuit 330 may include third and fourth NMOS transistors N13 and N14 operating according to the isolation signal ISO. The third NMOS transistor N13 may be connected between the internal node IND and the bit line BL, and the fourth NMOS transistor N14 may be connected between the complementary internal node INDB and the complementary bit line BLB. The third NMOS transistor N13 and the fourth NMOS transistor N14 may be designed to have the same size. In some embodiments, the third NMOS transistor N13 and the fourth NMOS transistor N14 may be designed to have different sizes.

The equalization circuit 340 may include a fifth NMOS transistor N15 operating according to the bit line equalizing signal BLEQ and a sixth NMOS transistor N16 operating according to the equalizing signal PEQ. The fifth NMOS transistor N15 may be connected between the internal node IND and the complementary internal node INDB, and the sixth NMOS transistor N16 may be connected between the equalizing driving signal line EQL and the complementary internal node INDB.

Hereinafter, configurations and operations of the sense amplifier 160 are particularly described through various embodiments.

Figure 4A:
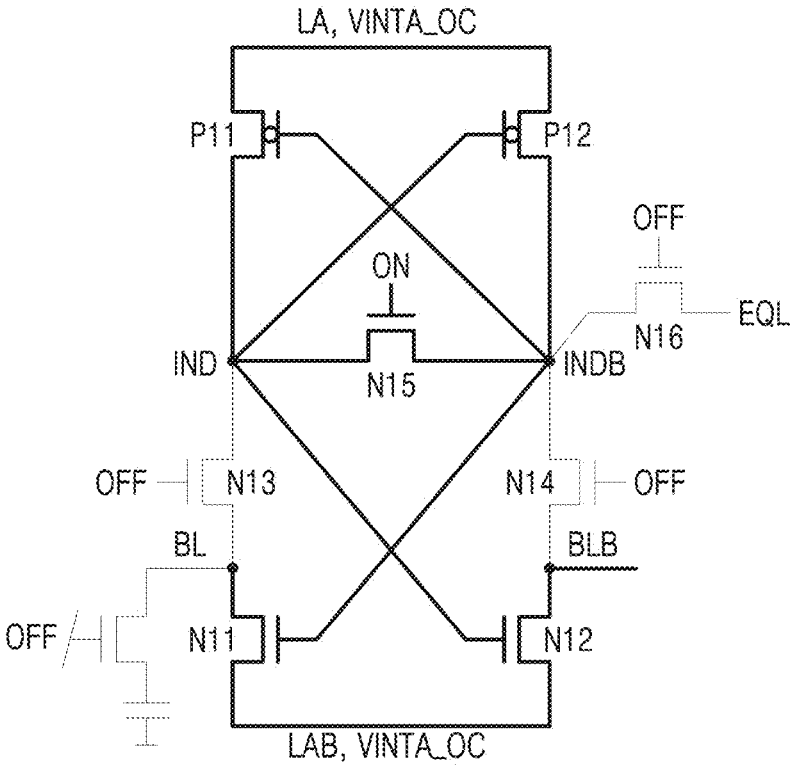
FIGS. 4A, 4B, 4C, and 5 illustrate an operation of a sense amplifier according to embodiments.
Figure 4B:
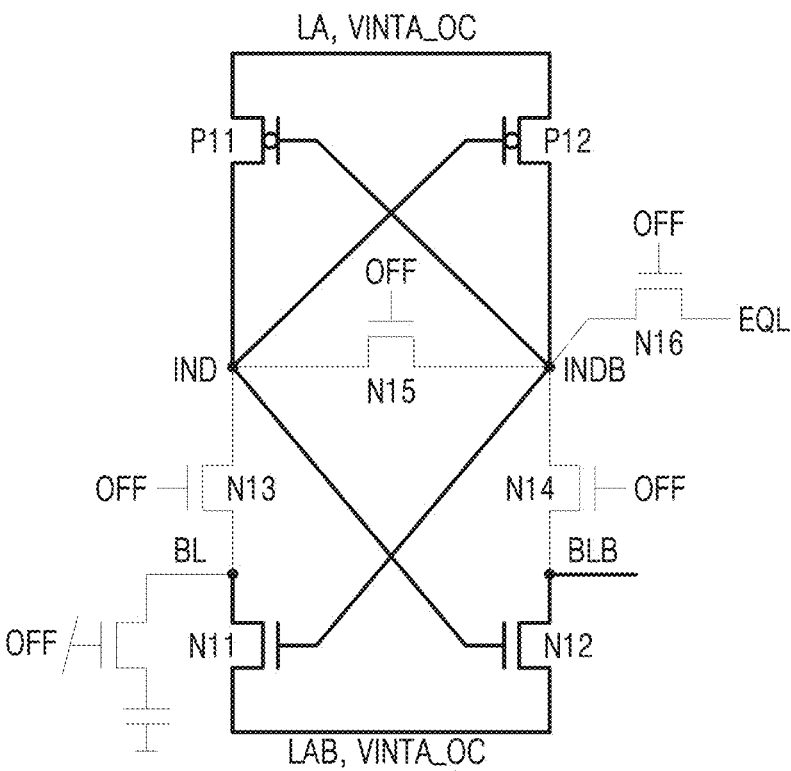
Figure 4C:
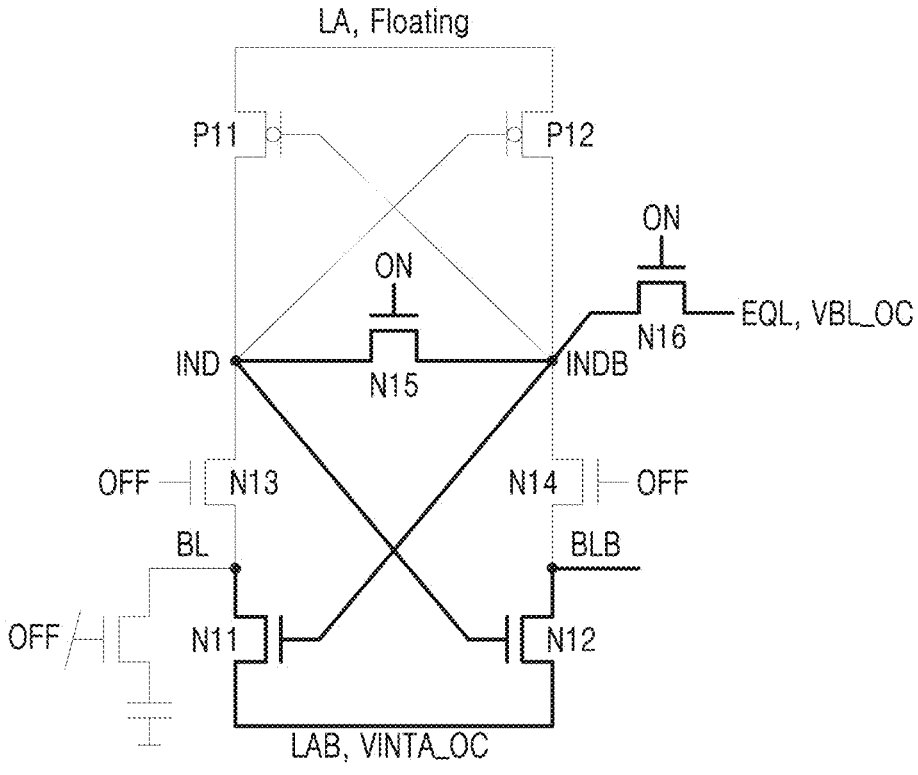

FIGS. 4A, 4B, 4C, and 5 illustrate an operation of a sense amplifier according to embodiments. FIGS. 4A, 4B, 4C, and 5 are circuit diagrams and a timing diagram illustrating timing of signals related to a sense amplifier according to embodiments. The circuit diagrams of FIGS. 4A, 4B, and 4C illustrate operations of removing a threshold voltage mismatch between the first and second PMOS transistors P11 and P12 of the P-type sense amplifier circuit 310, and a threshold voltage mismatch between the first and second NMOS transistors N11 and N12 of the N-type sense amplifier circuit 320 in the sense amplifier 160 of FIG. 3. Hereinafter, for convenience of description, a threshold voltage mismatch between transistors may be referred to as an offset voltage. In addition, removing a threshold voltage mismatch may be referred to as compensating for an offset voltage. In the timing diagrams to be described below, the horizontal axis and the vertical axis indicate time and voltage level, respectively, which are not necessarily shown at a certain ratio.

Figure 5:
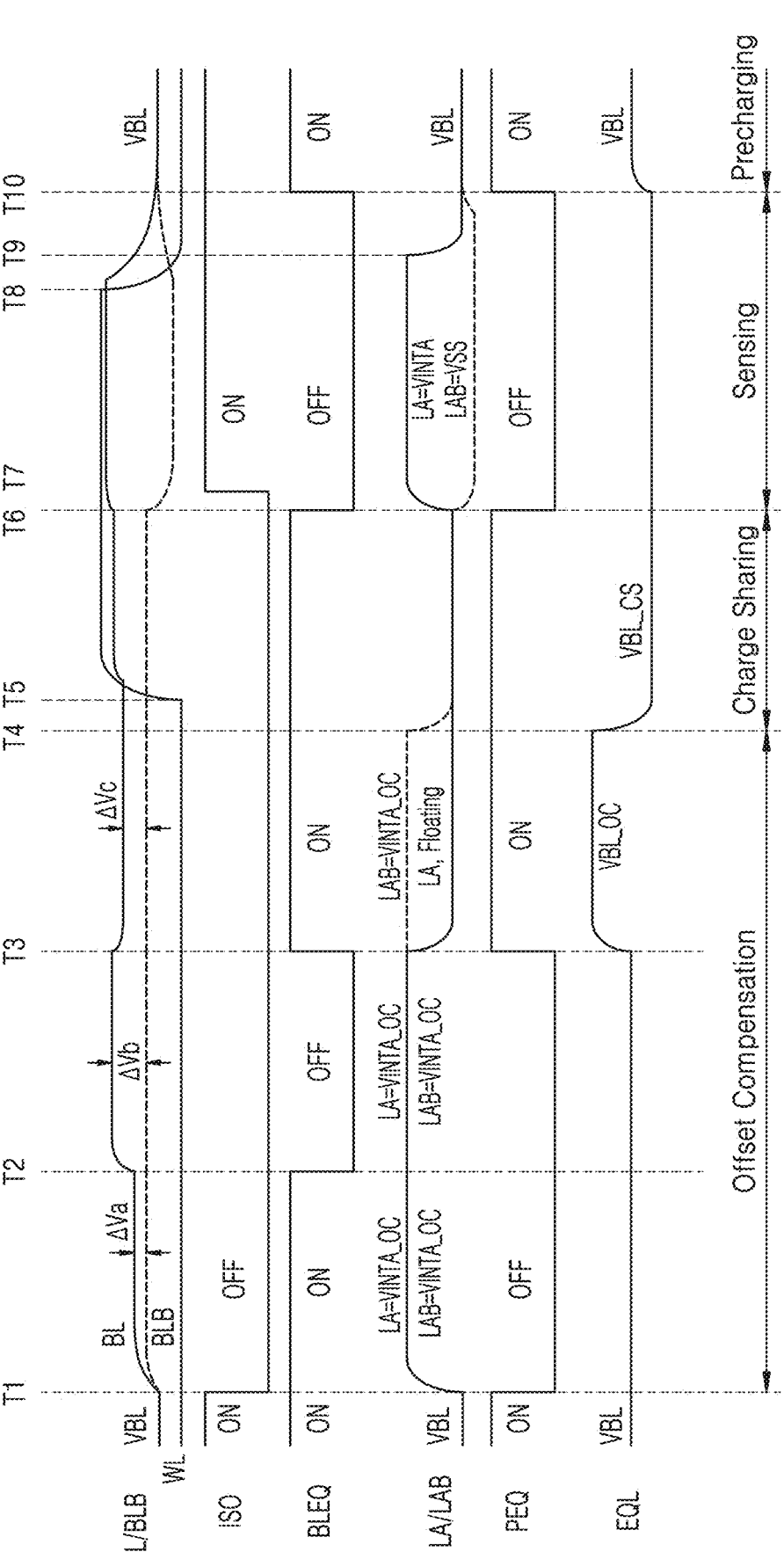

Referring to FIGS. 4A and 5, between time points T1 and T2, the word line WL may be in a disable state, the third and fourth NMOS transistors N13 and N14 may be in a turn-off state by the isolation signal ISO of a logic low level (sometimes, referred to as off), the fifth NMOS transistor N15 may be in a turn-on state by the bit line equalizing signal BLEQ of a logic high level (sometimes, referred to as on), and the sixth NMOS transistor N16 may be in the turn-off state by the equalizing signal PEQ of the logic low level. The second internal power source voltage VINTA_OC may be provided to the first and second sensing driving signal lines LA and LAB, and the first bit line precharge voltage VBL may be applied to the equalizing driving signal line EQL. Hereinafter, to simplify a circuit connection relationship, a transistor in the turn-off state is represented to be light in that the transistor is not connected, and a transistor in the turn-on state is represented to be bold in that the transistor is connected.

Before the time point T1, the precharging operation to be described at a time point T10 may be performed. Performing the precharging operation indicates that the bit line BL and the complementary bit line BLB are equalized to the first bit line precharge voltage VBL provided through the equalizing driving signal line EQL, by the equalizing signal PEQ, the bit line equalizing signal BLEQ, and the isolation signal ISO which have the logic high level. Herein, the bit line BL has no voltage difference from the complementary bit line BLB.

Between the time points T1 and T2, the internal node IND and the complementary internal node INDB may have the level of the first bit line precharge voltage VBL by the fifth NMOS transistor N15 that is turned on. A difference in voltage between the bit line BL and the complementary bit line BLB may be a first voltage difference ΔVa due to the first and second NMOS transistors N11 and N12 respectively connected to the complementary internal node INDB and the internal node IND which have the level of the first bit line precharge voltage VBL. In this example, it is assumed that the bit line BL and the complementary bit line BLB have the first voltage difference ΔVa therebetween because the bit line BL has a higher voltage than the complementary bit line BLB by a certain level. This is only an example for helping understanding and embodiments are not limited thereto. The first voltage difference ΔVa may be analyzed as a first offset voltage according to the threshold voltage difference of the first and second NMOS transistors N11 and N12. By offsetting the voltage between the bit line BL and the complementary bit line BLB by the first offset voltage, noise according to the threshold voltage difference of the first and second NMOS transistors N11 and N12 is cancelled. That is, the sense amplifier 160 may compensate for the offset noise using the first offset voltage.

Referring to FIGS. 4B and 5, between time points T2 and T3, the bit line equalizing signal BLEQ may transition to the logic low level such that the fifth NMOS transistor N15 changes to the turn-off state. Accordingly, the internal node IND and the complementary internal node INDB may be developed to different voltage levels by the first and second PMOS transistors P11 and P12. A difference in voltage between the bit line BL and the complementary bit line BLB may be a second voltage difference ΔVb due to the first and second NMOS transistors N11 and N12 respectively connected to the complementary internal node INDB and the internal node IND which have different voltage levels.

Between the time points T2 and T3, the second voltage difference ΔVb between the bit line BL and the complementary bit line BLB is caused by the internal node IND and the complementary internal node INDB being developed to different voltage levels by the first and second PMOS transistors P11 and P12. The second voltage difference ΔVb may be analyzed as a second offset voltage according to the threshold voltage difference of the first and second PMOS transistors P11 and P12. Having the second offset voltage indicating a difference between the bit line BL and the complementary bit line BLB indicates that offset noise according to the threshold voltage difference of the first and second PMOS transistors P11 and P12 is cancelled. That is, the sense amplifier 160 may compensate for the offset noise using the second offset voltage.

Referring to FIGS. 4C and 5, between time points T3 and T4, the bit line equalizing signal BLEQ may transition to the logic high level such that the fifth NMOS transistor N15 changes to the turn-on state, and the equalizing signal PEQ may transition to the logic high level such that the sixth NMOS transistor N16 changes to the turn-on state. In addition, the first sensing driving signal line LA may float, and the second bit line precharge voltage VBL_OC higher than the first bit line precharge voltage VBL may be provided to the equalizing driving signal line EQL.

Between the time points T3 and T4, the internal node IND and the complementary internal node INDB may have the level of the second bit line precharge voltage VBL_OC by the fifth and sixth NMOS transistors N15 and N16 that are turned on. A difference in voltage between the bit line BL and the complementary bit line BLB may be a third voltage difference ΔVc due to the first and second NMOS transistors N11 and N12 respectively connected to the complementary internal node INDB and the internal node IND which have the level of the second bit line precharge voltage VBL_OC. The third voltage difference ΔVc may be analyzed as a third offset voltage according to the threshold voltage difference of the first and second NMOS transistors N11 and N12. Having the third offset voltage indicating a difference between the bit line BL and the complementary bit line BLB indicates that offset noise according to the threshold voltage difference of the first and second NMOS transistors N11 and N12 is cancelled. That is, the sense amplifier 160 may compensate for the offset noise using the third offset voltage.

In some embodiments, the bit line BL and the complementary bit line BLB have the first voltage difference ΔVa, the second voltage difference ΔVb, and the third voltage difference ΔVc therebetween during the offset compensation operation, wherein each of the first, second, and third voltage differences ΔVa, ΔVb, and ΔVc represents a voltage difference occurring by timing of certain signals. This is only an example for helping understanding and embodiments are not limited thereto.

The voltage difference between the bit line BL and the complementary bit line BLB may be used for cancellation of offset noise due to the threshold voltage difference of the first and second PMOS transistors P11 and P12 in the P-type sense amplifier circuit 310 and the threshold voltage difference of the first and second NMOS transistors N11 and N12 in the N-type sense amplifier circuit 320. Accordingly, reliability and accuracy may be provided to the sensing operation of the sense amplifier 160.

In FIG. 5, the offset compensation operation is performed by the sense amplifier 160 from the time point T1 to the time point T4. The charge sharing operation is performed from the time point T4 to a time point T6, the sensing operation is performed from the time point T6 to the time point T10, and the precharging operation is performed at the time point T10. This is only an example for helping understanding and embodiments are not limited thereto. The charge sharing operation, the sensing operation, and the precharging operation are described with reference to FIG. 3.

Referring to FIGS. 3 and 5, the charge sharing operation may be performed between the time points T4 and T6. At the time point T4, the second sensing driving signal line LAB may float, and the third bit line precharge voltage VBL_CS lower than the first bit line precharge voltage VBL may be applied to the equalizing driving signal line EQL. In some embodiments, the third bit line precharge voltage VBL_CS may be configured to have the level of a ground voltage VSS. At a time point T5, the word line WL may be activated. Charge sharing occurs between the cell capacitor of the memory cell MC connected to the activated word line WL and the bit line BL. When data '1' is stored in the memory cell MC, the voltage level of the bit line BL may increase by a certain level in the charge sharing operation. When data 'O' is stored in the memory cell MC, the voltage level of the bit line BL may decrease by a certain level in the charge sharing operation.

The sensing operation may be performed between the time points T6 and T10. At the time point T6, the bit line equalizing signal BLEQ may transition to the logic low level such that the fifth NMOS transistor N15 changes to the turn-off state, and the equalizing signal PEQ may transition to the logic low level such that the sixth NMOS transistor N16 changes to the turn-off state. In addition, the first internal power source voltage VINTA may be provided to the first sensing driving signal line LA and the ground voltage VSS may be provided to the second sensing driving signal line LAB. At the time point T6 where the equalizing signal PEQ and the bit line equalizing signal BLEQ transition to the logic low level, based on the voltage difference of the bit line BL and the complementary bit line BLB, the voltage level of the bit line BL may increase to the level of the first internal power source voltage VINTA and the voltage level of the complementary bit line BLB may decrease to the level of the ground voltage VSS. The time point T6 may be referred to as a sampling time point of the sensing operation.

At a time point T7, the isolation signal ISO may transition to the logic high level such that the third and fourth NMOS transistors N13 and N14 change to the turn-on state. The internal node IND may be connected to the bit line BL, and the complementary internal node INDB may be connected to the complementary bit line BLB. The voltage level of the bit line BL may increase to the voltage level of the internal node IND, and charges corresponding to the voltage level of the bit line BL may be restored in the cell capacitor of the memory cell MC. At a time point T8, the word line WL may be inactivated, and at a time point T9, the first bit line precharge voltage VBL may be provided to the first sensing driving signal line LA.

At the time point T10, the precharging operation may be performed. The bit line equalizing signal BLEQ and the equalizing signal PEQ may transition to the logic high level such that the fifth and sixth NMOS transistors N15 and N16 change to the turn-on state. The first bit line precharge voltage VBL may be provided to the second sensing driving signal line LAB, and the first bit line precharge voltage VBL may also be provided to the equalizing driving signal line EQL. Accordingly, the bit line BL and the complementary bit line BLB may be precharged to the first bit line precharge voltage VBL provided through the equalizing driving signal line EQL.

Figure 6A:
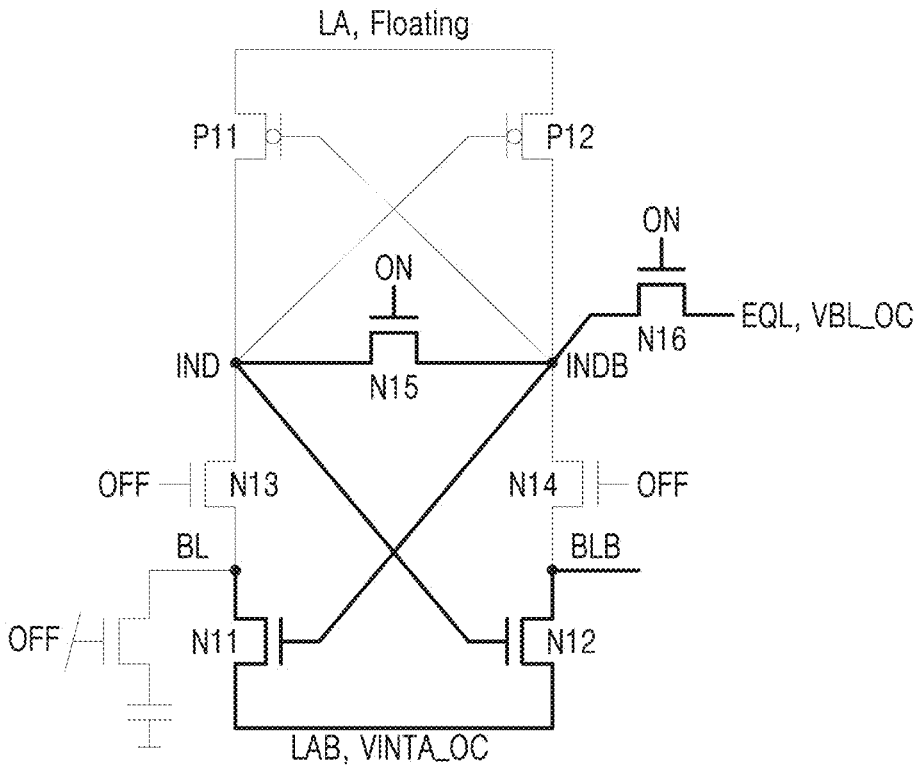
FIGS. 6A, 6B, 6C, and 7 illustrate an operation of a sense amplifier according to embodiments.
Figure 6B:
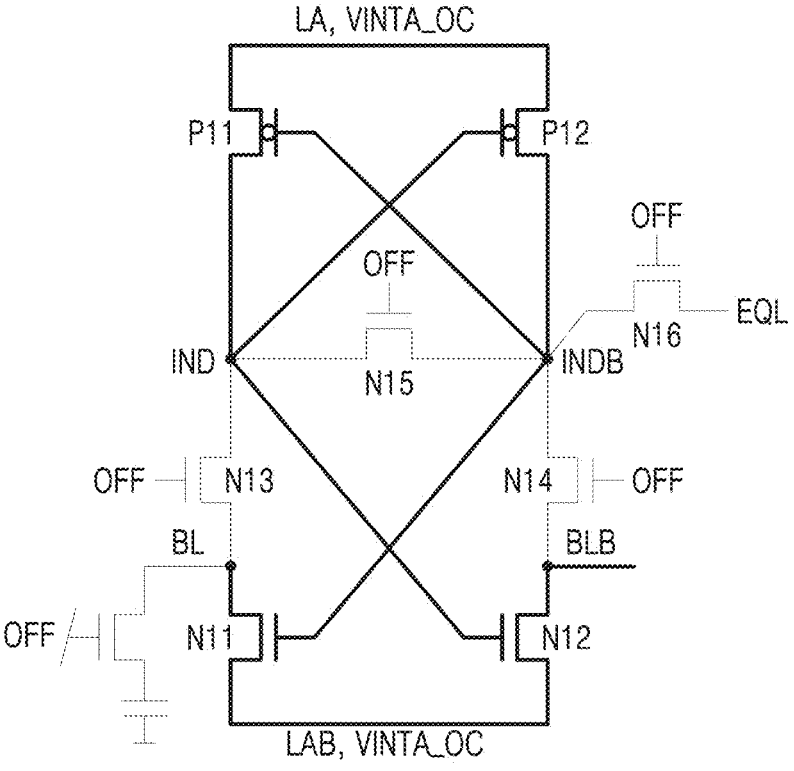
Figure 6C:
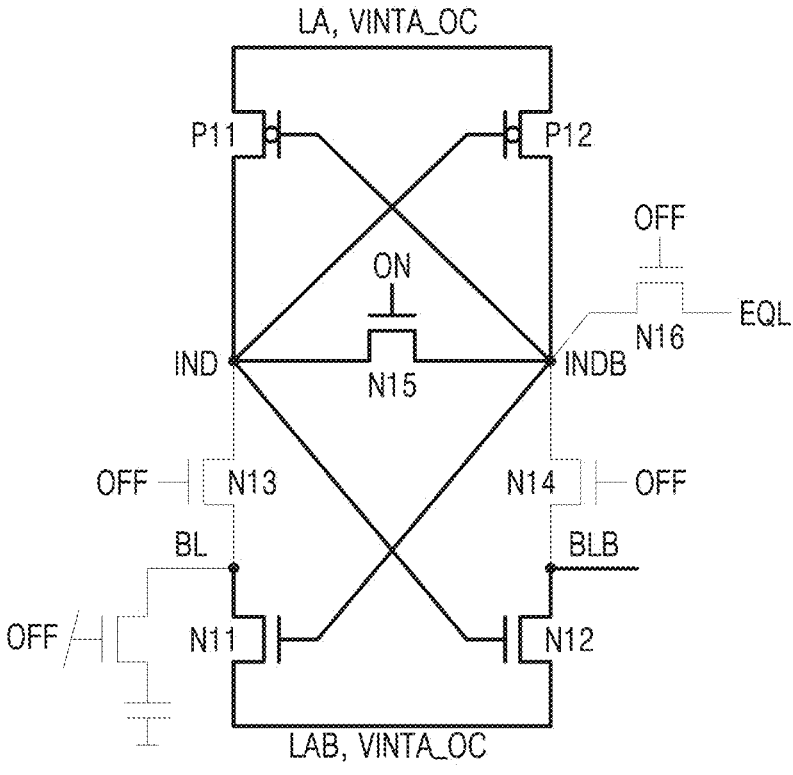
Figure 7:
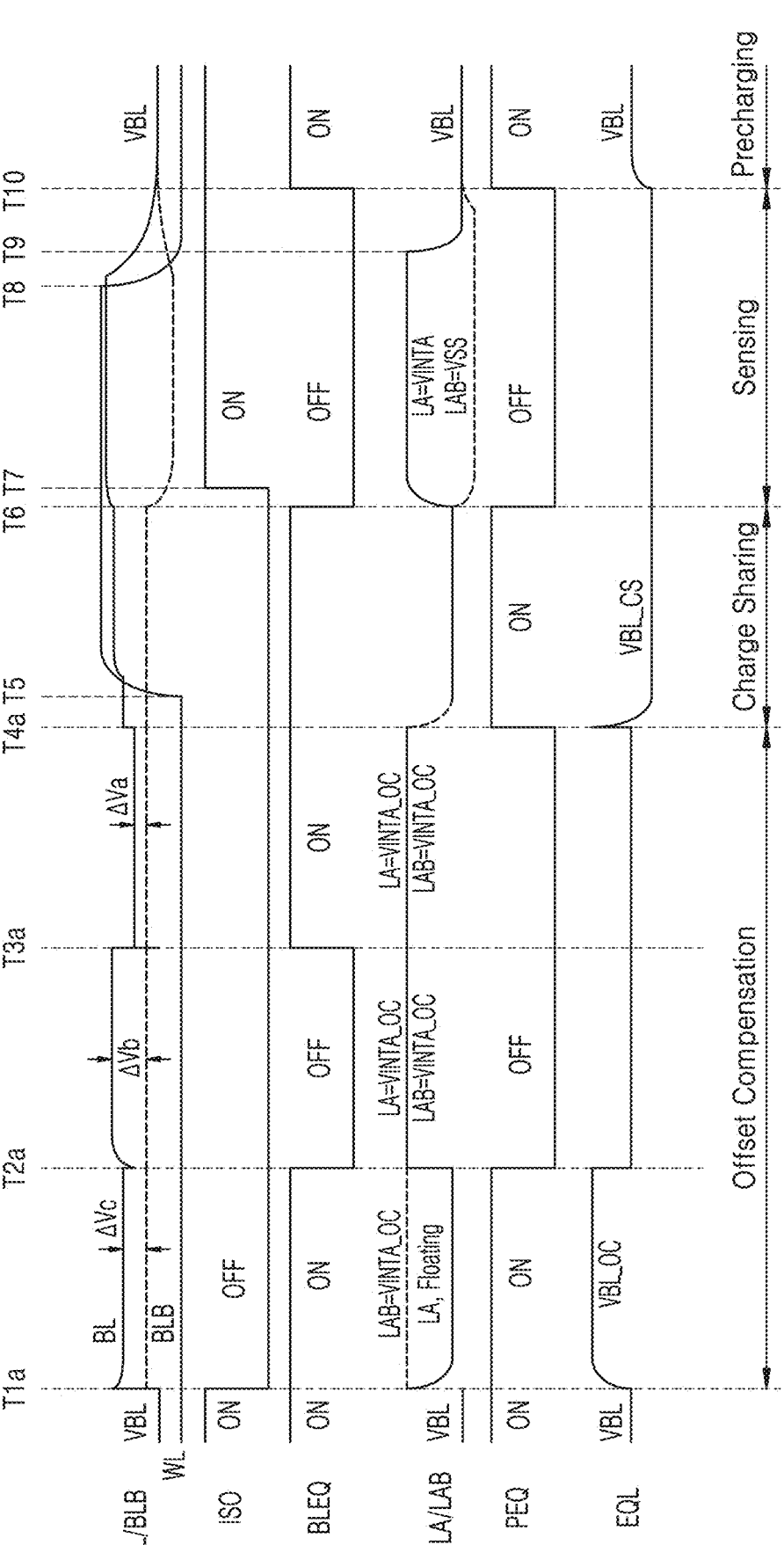

FIGS. 6A, 6B, 6C, and 7 illustrate an operation of a sense amplifier according to embodiments. FIGS. 6A, 6B, and 6C are circuit diagrams illustrating the offset compensation operation performed by the sense amplifier 160 of FIG. 3. FIG. 7 is a timing diagram illustrating signals related to the offset compensation operation of FIGS. 6A, 6B, and 6C. In FIG. 7, the charge sharing operation, the sensing operation, and the precharging operation except for the offset compensation operation of the sense amplifier 160 are the same as described above with reference to FIG. 5, and thus, the description made with reference to FIG. 5 is omitted herein.

Referring to FIGS. 6A and 7, before a time point T1a, the bit line BL and the complementary bit line BLB are precharged to the level of the first bit line precharge voltage VBL provided through the equalizing driving signal line EQL, by the equalizing signal PEQ, the bit line equalizing signal BLEQ, and the isolation signal ISO which have the logic high level. Between time points T1a and T2a, the isolation signal ISO may transition to the logic low level such that the third and fourth NMOS transistors N13 and N14 change to the turn-off state. In addition, the first sensing driving signal line LA may float, the second internal power source voltage VINTA_OC may be provided to the second sensing driving signal line LAB, and the second bit line precharge voltage VBL_OC higher than the first bit line precharge voltage VBL may be provided to the equalizing driving signal line EQL.

Between the time points T1a and T2a, the internal node IND and the complementary internal node INDB may have the level of the second bit line precharge voltage VBL_OC by the fifth and sixth NMOS transistors N15 and N16 that are turned on. A difference in voltage between the bit line BL and the complementary bit line BLB may be the third voltage difference ΔVc due to the first and second NMOS transistors N11 and N12 respectively connected to the complementary internal node INDB and the internal node IND which have the level of the second bit line precharge voltage VBL_OC. The third voltage difference ΔVc may be the third offset voltage according to the threshold voltage difference of the first and second NMOS transistors N11 and N12. With a difference of the third offset voltage between the bit line BL and the complementary bit line BLB, the sense amplifier 160 may compensate for the offset noise using the third offset voltage according to the threshold voltage difference of the first and second NMOS transistors N11 and N12.

Referring to FIGS. 6B and 7, between time points T2a and T3a, the bit line equalizing signal BLEQ and the equalizing signal PEQ may transition to the logic low level such that the fifth and sixth NMOS transistors N15 and N16 change to the turn-off state. In addition, the second internal power source voltage VINTA_OC may be provided to the first sensing driving signal line LA, and the first bit line precharge voltage VBL may be provided to the equalizing driving signal line EQL. Accordingly, the internal node IND and the complementary internal node INDB may be developed to different voltage levels by the first and second PMOS transistors P11 and P12. A difference in voltage between the bit line BL and the complementary bit line BLB may be the second voltage difference ΔVb due to the first and second NMOS transistors N11 and N12 respectively connected to the complementary internal node INDB and the internal node IND which have different voltage levels.

Between the time points T2a and T3a, the second voltage difference ΔVb between the bit line BL and the complementary bit line BLB is caused by the internal node IND and the complementary internal node INDB being developed to the different voltage levels by the first and second PMOS transistors P11 and P12. The second voltage difference ΔVb may be the second offset voltage according to the threshold voltage difference of the first and second PMOS transistors P11 and P12. With a difference of the second offset voltage between the bit line BL and the complementary bit line BLB, the sense amplifier 160 may compensate for the offset noise using the second offset voltage according to the threshold voltage difference of the first and second PMOS transistors P11 and P12.

Referring to FIGS. 6C and 7, between time points T3a and T4a, the bit line equalizing signal BLEQ may transition to the logic high level such that the fifth NMOS transistor N15 changes to the turn-on state. The internal node IND and the complementary internal node INDB may be connected and have the same certain voltage level because the fifth NMOS transistor N15 is turned on, and a voltage difference between the bit line BL and the complementary internal node INDB may be the first voltage difference ΔVa due to the first and second NMOS transistors N11 and N12 respectively connected to the complementary internal node INDB and the internal node IND. The first voltage difference ΔVa may be the first offset voltage according to the threshold voltage difference of the first and second NMOS transistors N11 and N12. With a difference of the first offset voltage between the bit line BL and the complementary bit line BLB, the sense amplifier 160 may compensate for the offset noise using the first offset voltage according to the threshold voltage difference of the first and second NMOS transistors N11 and N12.

In FIG. 7, after the offset compensation operation performed by the sense amplifier 160 from the time point T1a to the time point T4a, the charge sharing operation may be performed from the time point T4a to the time point T6, the sensing operation may be performed from the time point T6 to the time point T10, and the precharging operation may be performed at the time point T10.

Figure 8A:
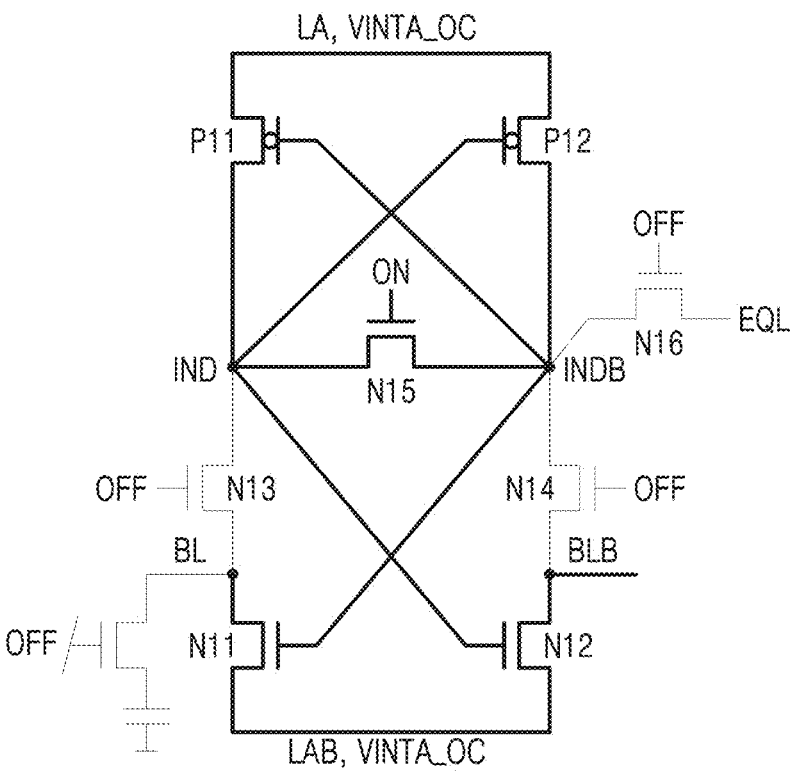
FIGS. 8A, 8B, 8C, and 9 illustrate an operation of a sense amplifier according to embodiments.
Figure 8B:
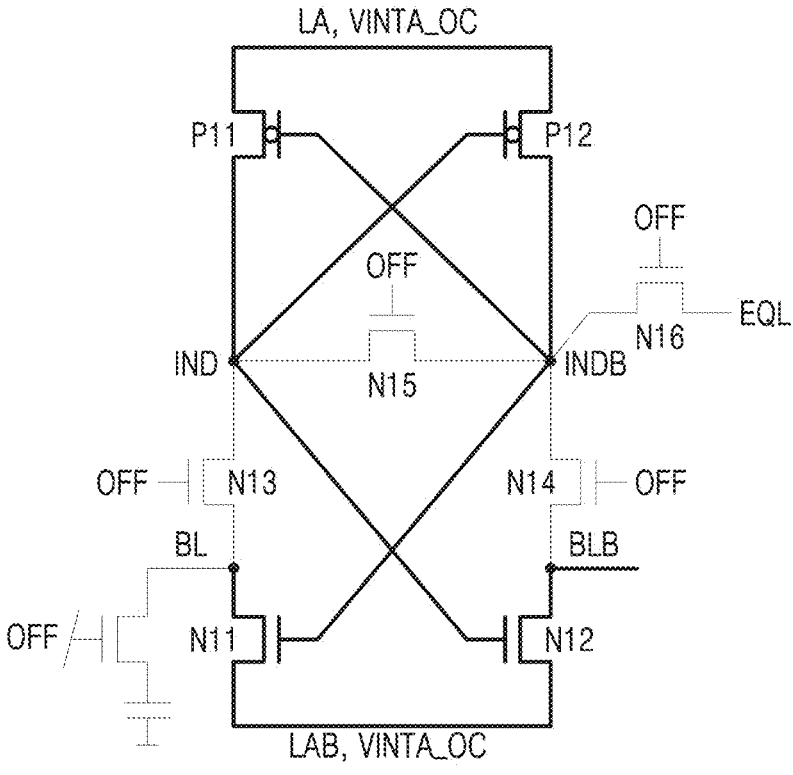
Figure 8C:
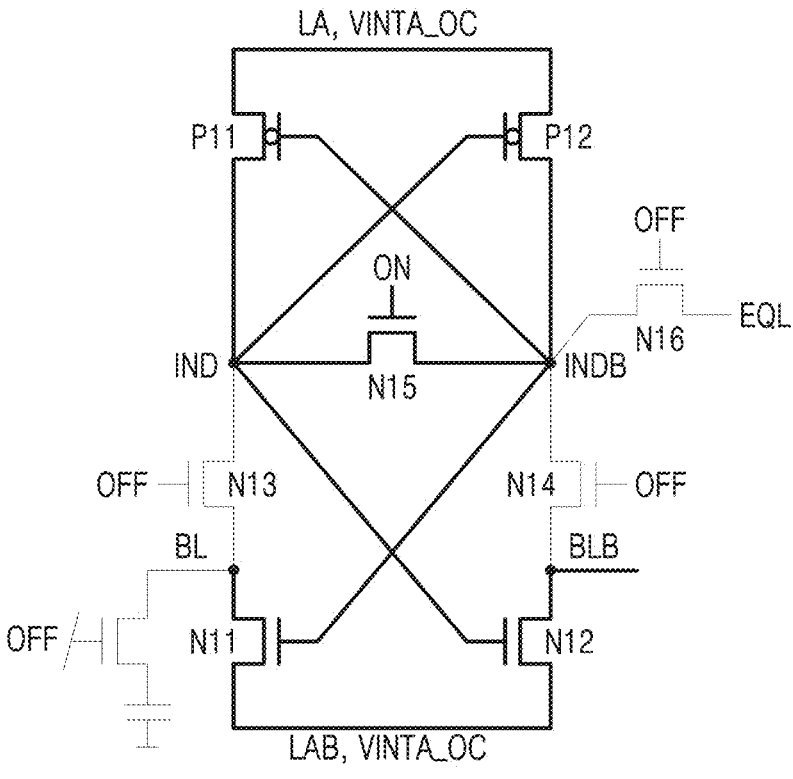
Figure 9:
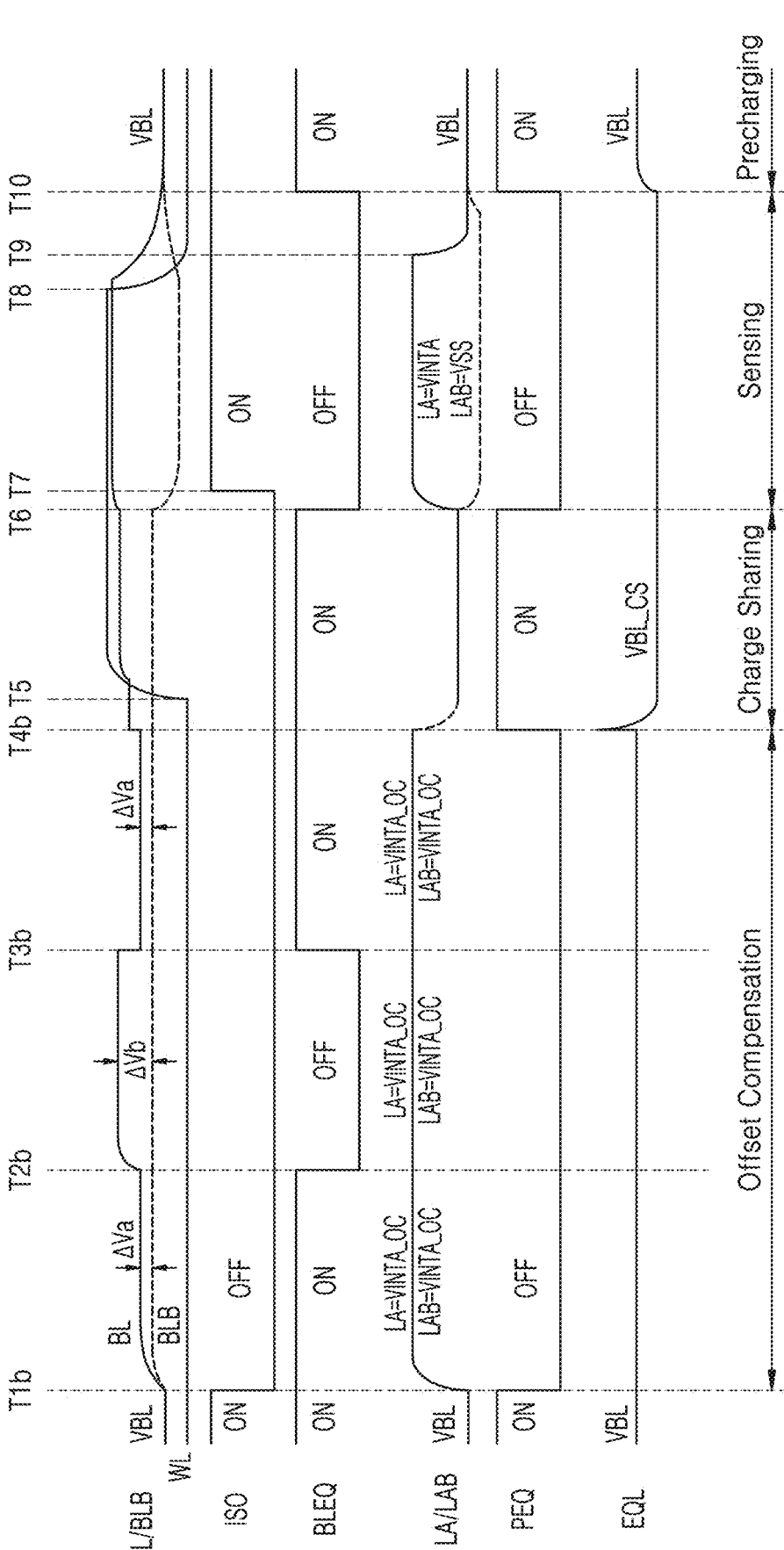

FIGS. 8A, 8B, 8C, and 9 illustrate an operation of a sense amplifier according to embodiments. FIGS. 8A, 8B, and 8C are circuit diagrams illustrating the offset compensation operation performed by the sense amplifier 160 of FIG. 3. FIG. 9 is a timing diagram illustrating signals related to the offset compensation operation of FIGS. 8A, 8B, and 8C. In FIG. 9, the charge sharing operation, the sensing operation, and the precharging operation except for the offset compensation operation of the sense amplifier 160 are the same as described above with reference to FIG. 5, and thus, the description made with reference to FIG. 5 is omitted herein.

Referring to FIGS. 8A and 9, before a time point T1b, the bit line BL and the complementary bit line BLB are precharged to the level of the first bit line precharge voltage VBL provided through the equalizing driving signal line EQL, by the equalizing signal PEQ, the bit line equalizing signal BLEQ, and the isolation signal ISO which have the logic high level. Between time points T1b an T2b, the isolation signal ISO may transition to the logic low level such that the third and fourth NMOS transistors N13 and N14 change to the turn-off state, and the equalizing signal PEQ may transition to the logic low level such that the sixth NMOS transistor N16 changes to the turn-off state. In addition, the second internal power source voltage VINTA_OC may be provided to the first and second sensing driving signal lines LA and LAB.

Between the time points T1b and T2b, the internal node IND and the complementary internal node INDB may have the level of the first bit line precharge voltage VBL by the fifth NMOS transistor N15 that is turned on. A difference in voltage between the bit line BL and the complementary bit line BLB may be the first voltage difference ΔVa due to the first and second NMOS transistors N11 and N12 respectively connected to the complementary internal node INDB and the internal node IND which have the level of the first bit line precharge voltage VBL. The first voltage difference ΔVa may be the first offset voltage according to the threshold voltage difference of the first and second NMOS transistors N11 and N12. With a difference of the first offset voltage between the bit line BL and the complementary bit line BLB, the sense amplifier 160 may compensate for the offset noise using the first offset voltage according to the threshold voltage difference of the first and second NMOS transistors N11 and N12.

Referring to FIGS. 8B and 9, between time points T2b and T3b, the bit line equalizing signal BLEQ may transition to the logic low level such that the fifth NMOS transistor N15 changes to the turn-off state. Accordingly, the internal node IND and the complementary internal node INDB may be developed to different voltage levels by the first and second PMOS transistors P11 and P12. A difference in voltage between the bit line BL and the complementary bit line BLB may be the second voltage difference ΔVb due to the first and second NMOS transistors N11 and N12 respectively connected to the complementary internal node INDB and the internal node IND which have different voltage levels.

Between the time points T2b and T3b, the second voltage difference ΔVb between the bit line BL and the complementary bit line BLB is caused by the internal node IND and the complementary internal node INDB being developed to the different voltage levels by the first and second PMOS transistors P11 and P12. The second voltage difference ΔVb may be the second offset voltage according to the threshold voltage difference of the first and second PMOS transistors P11 and P12. With a difference of the second offset voltage between the bit line BL and the complementary bit line BLB, the sense amplifier 160 may compensate for the offset noise using the second offset voltage according to the threshold voltage difference of the first and second PMOS transistors P11 and P12.

Referring to FIGS. 8C and 9, between time points T3b and T4b, the bit line equalizing signal BLEQ may transition to the logic high level such that the fifth NMOS transistor N15 changes to the turn-on state. The internal node IND and the complementary internal node INDB may be connected and have the same certain voltage level because the fifth NMOS transistor N15 is turned on, and a difference in voltage between the bit line BL and the complementary internal node INDB may be the first voltage difference ΔVa due to the first and second NMOS transistors N11 and N12 respectively connected to the complementary internal node INDB and the internal node IND. The first voltage difference ΔVa may be the first offset voltage according to the threshold voltage difference of the first and second NMOS transistors N11 and N12. With a difference of the first offset voltage between the bit line BL and the complementary bit line BLB, the sense amplifier 160 may compensate for the offset noise using the first offset voltage according to the threshold voltage difference of the first and second NMOS transistors N11 and N12.

In FIG. 9, after the offset compensation operation performed by the sense amplifier 160 from the time point T1b to the time point T4b, the charge sharing operation may be performed from the time point T4b to the time point T6, the sensing operation may be performed from the time point T6 to the time point T10, and the precharging operation may be performed at the time point T10.

Figure 10A:
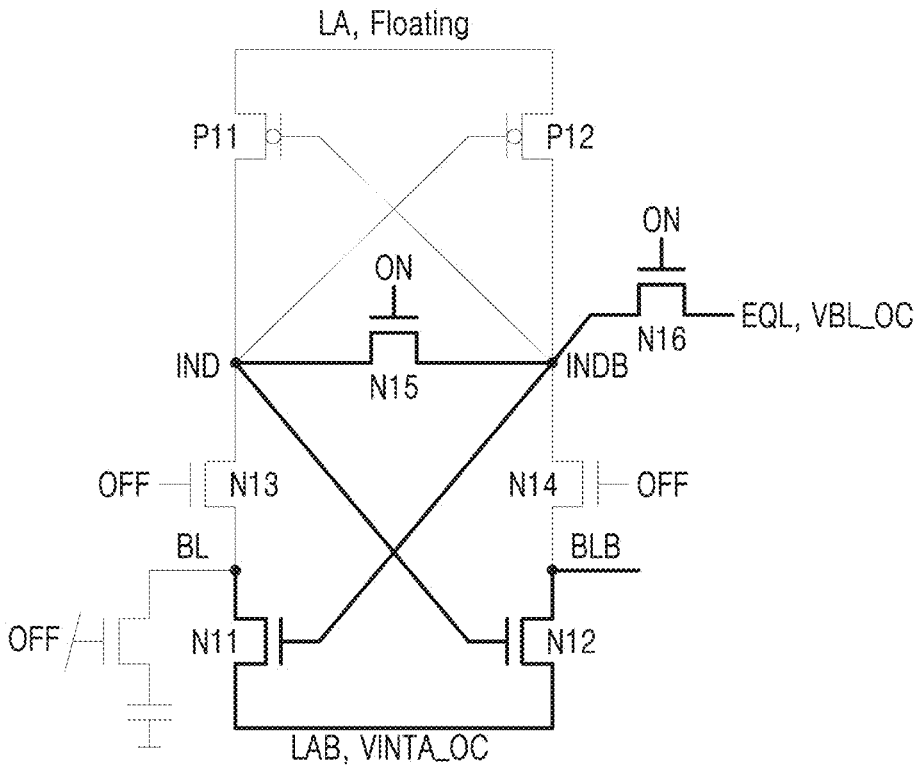
FIGS. 10A, 10B, 10C, and 11 illustrate an operation of a sense amplifier according to embodiments.
Figure 10B:
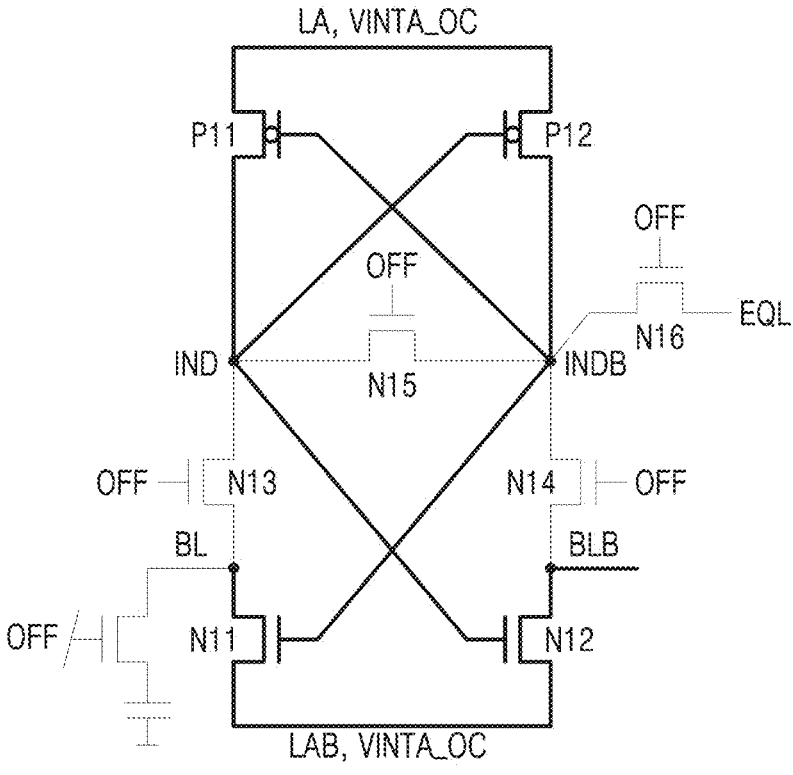
Figure 10C:
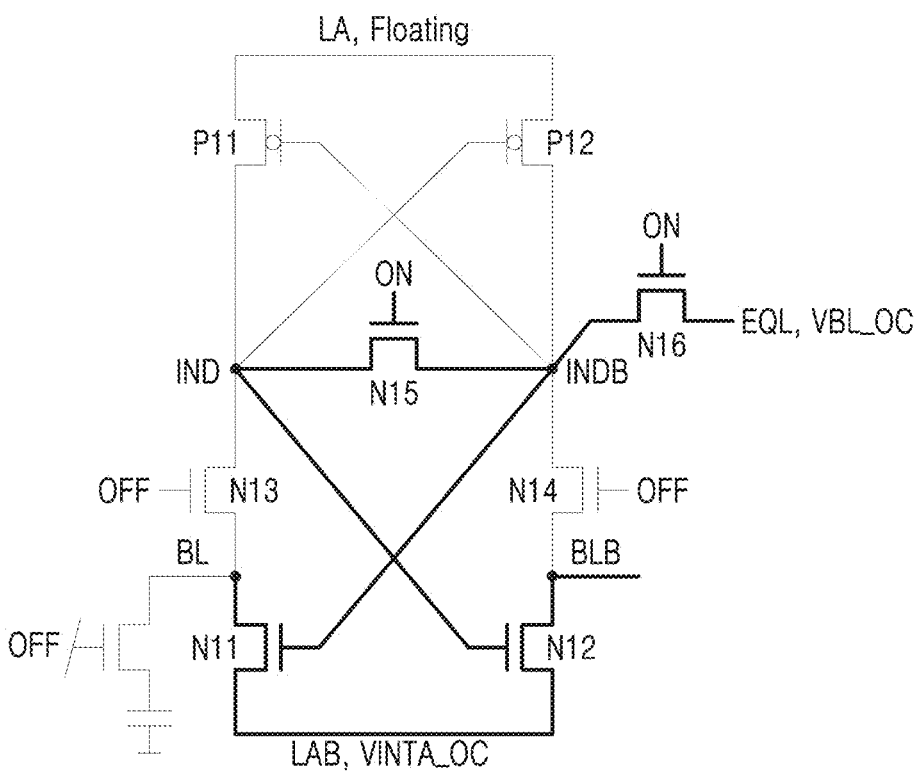
Figure 11:
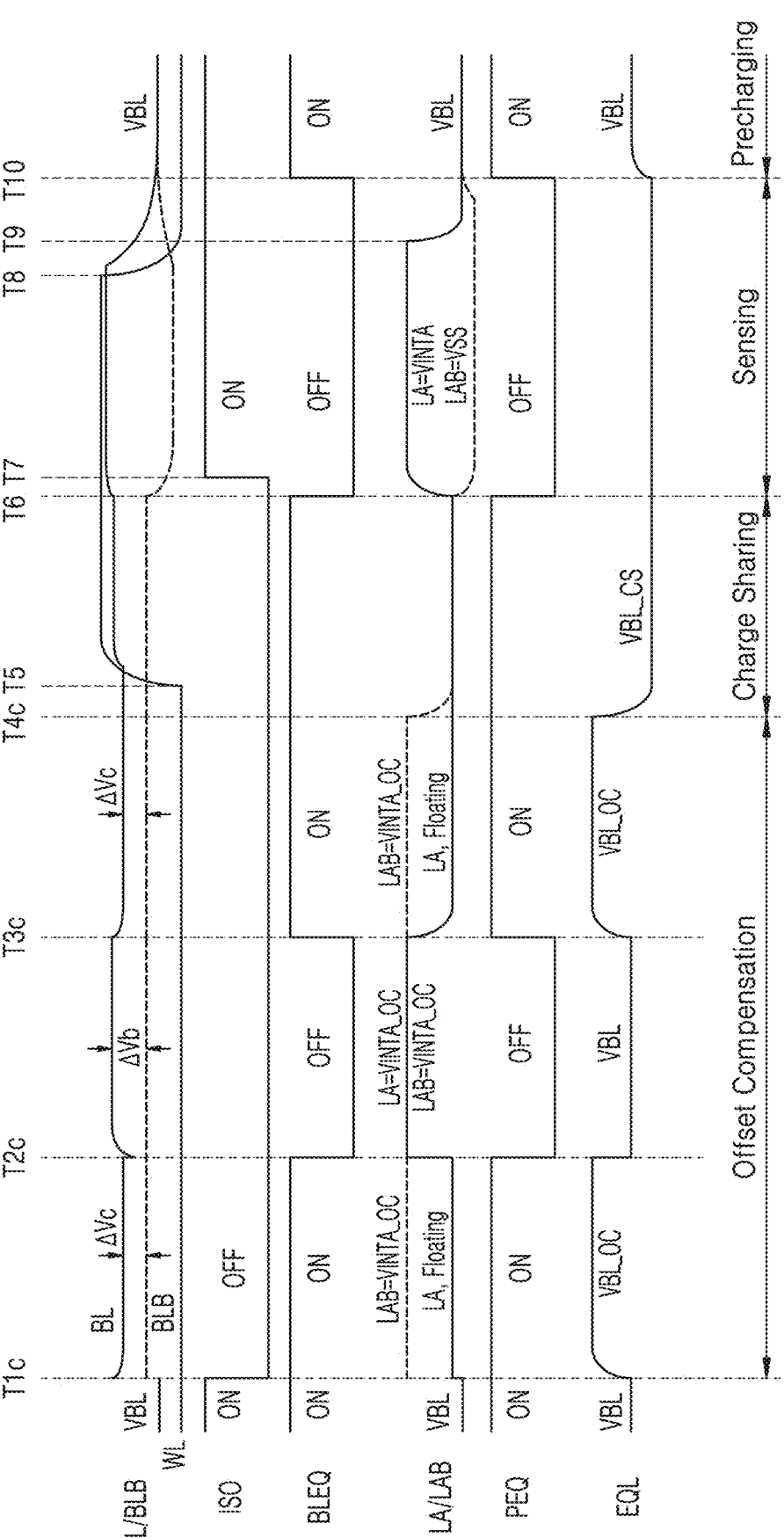

FIGS. 10A, 10B, 10C, and 11 illustrate an operation of a sense amplifier according to embodiments. FIGS. 10A, 10B, and 10C are circuit diagrams illustrating the offset compensation operation performed by the sense amplifier 160 of FIG. 3. FIG. 11 is a timing diagram illustrating signals related to the offset compensation operation of FIGS. 10A, 10B, and 10C. In FIG. 11, the charge sharing operation, the sensing operation, and the precharging operation except for the offset compensation operation of the sense amplifier 160 are the same as described above with reference to FIG. 5, and thus, the description made with reference to FIG. 5 is omitted herein.

Referring to FIGS. 10A and 11, before a time point T1c, the bit line BL and the complementary bit line BLB have no voltage difference therebetween because the bit line BL and the complementary bit line BLB are precharged to the level of the first bit line precharge voltage VBL provided through the equalizing driving signal line EQL, by the equalizing signal PEQ, the bit line equalizing signal BLEQ, and the isolation signal ISO which have the logic high level. Between time points T1c and T2c, the isolation signal ISO may transition to the logic low level such that the third and fourth NMOS transistors N13 and N14 change to the turn-off state. In addition, the first sensing driving signal line LA may float, the second internal power source voltage VINTA_OC may be provided to the second sensing driving signal line LAB, and the second bit line precharge voltage VBL_OC higher than the first bit line precharge voltage VBL may be provided to the equalizing driving signal line EQL.

Between the time points T1c and T2c, the internal node IND and the complementary internal node INDB may have the level of the second bit line precharge voltage VBL_OC by the fifth and sixth NMOS transistors N15 and N16 that are turned on. A difference in voltage between the bit line BL and the complementary bit line BLB may be the third voltage difference ΔVc due to the first and second NMOS transistors N11 and N12 respectively connected to the complementary internal node INDB and the internal node IND which have the level of the second bit line precharge voltage VBL_OC. The third voltage difference ΔVc may be the third offset voltage according to the threshold voltage difference of the first and second NMOS transistors N11 and N12. With a difference of the third offset voltage between the bit line BL and the complementary bit line BLB, the sense amplifier 160 may compensate for the offset noise using the third offset voltage according to the threshold voltage difference of the first and second NMOS transistors N11 and N12.

Referring to FIGS. 10B and 11, between time points T2c and T3c, the bit line equalizing signal BLEQ and the equalizing signal PEQ may transition to the logic low level such that the fifth and sixth NMOS transistors N15 and N16 change to the turn-off state. In addition, the second internal power source voltage VINTA_OC may be provided to the first sensing driving signal line LA, and the first bit line precharge voltage VBL may be provided to the equalizing driving signal line EQL. Accordingly, the internal node IND and the complementary internal node INDB may be developed to different voltage levels by the first and second PMOS transistors P11 and P12. A difference in voltage between the bit line BL and the complementary bit line BLB may be the second voltage difference ΔVb due to the first and second NMOS transistors N11 and N12 respectively connected to the complementary internal node INDB and the internal node IND which have different voltage levels.

Between the time points T2c and T3c, the second voltage difference ΔVb between the bit line BL and the complementary bit line BLB is caused by the internal node IND and the complementary internal node INDB being developed to the different voltage levels by the first and second PMOS transistors P11 and P12. The second voltage difference ΔVb may be the second offset voltage according to the threshold voltage difference of the first and second PMOS transistors P11 and P12. With a difference of the second offset voltage between the bit line BL and the complementary bit line BLB, the sense amplifier 160 may compensate for the offset noise using the second offset voltage according to the threshold voltage difference of the first and second PMOS transistors P11 and P12.

Referring to FIGS. 10C and 11, between time points T3c and T4c, the bit line equalizing signal BLEQ may transition to the logic high level such that the fifth NMOS transistor N15 changes to the turn-on state, and the equalizing signal PEQ may transition to the logic high level such that the sixth NMOS transistor N16 changes to the turn-on state. In addition, the first sensing driving signal line LA may float, and the second bit line precharge voltage VBL_OC higher than the first bit line precharge voltage VBL may be provided to the equalizing driving signal line EQL.

Between the time points T3c and T4c, the internal node IND and the complementary internal node INDB may have the level of the second bit line precharge voltage VBL_OC by the fifth and sixth NMOS transistors N15 and N16 that are turned on. A difference in voltage between the bit line BL and the complementary bit line BLB may be the third voltage difference ΔVc due to the first and second NMOS transistors N11 and N12 respectively connected to the complementary internal node INDB and the internal node IND which have the level of the second bit line precharge voltage VBL_OC. The third voltage difference ΔVc may be the third offset voltage according to the threshold voltage difference of the first and second NMOS transistors N11 and N12. With a difference of the third offset voltage between the bit line BL and the complementary bit line BLB, the sense amplifier 160 may compensate for the offset noise using the third offset voltage according to the threshold voltage difference of the first and second NMOS transistors N11 and N12.

In FIG. 11, after the offset compensation operation performed by the sense amplifier 160 from the time point T1c to the time point T4c, the charge sharing operation may be performed from the time point T4c to the time point T6, the sensing operation may be performed from the time point T6 to the time point T10, and the precharging operation may be performed at the time point T10.

Figure 12:
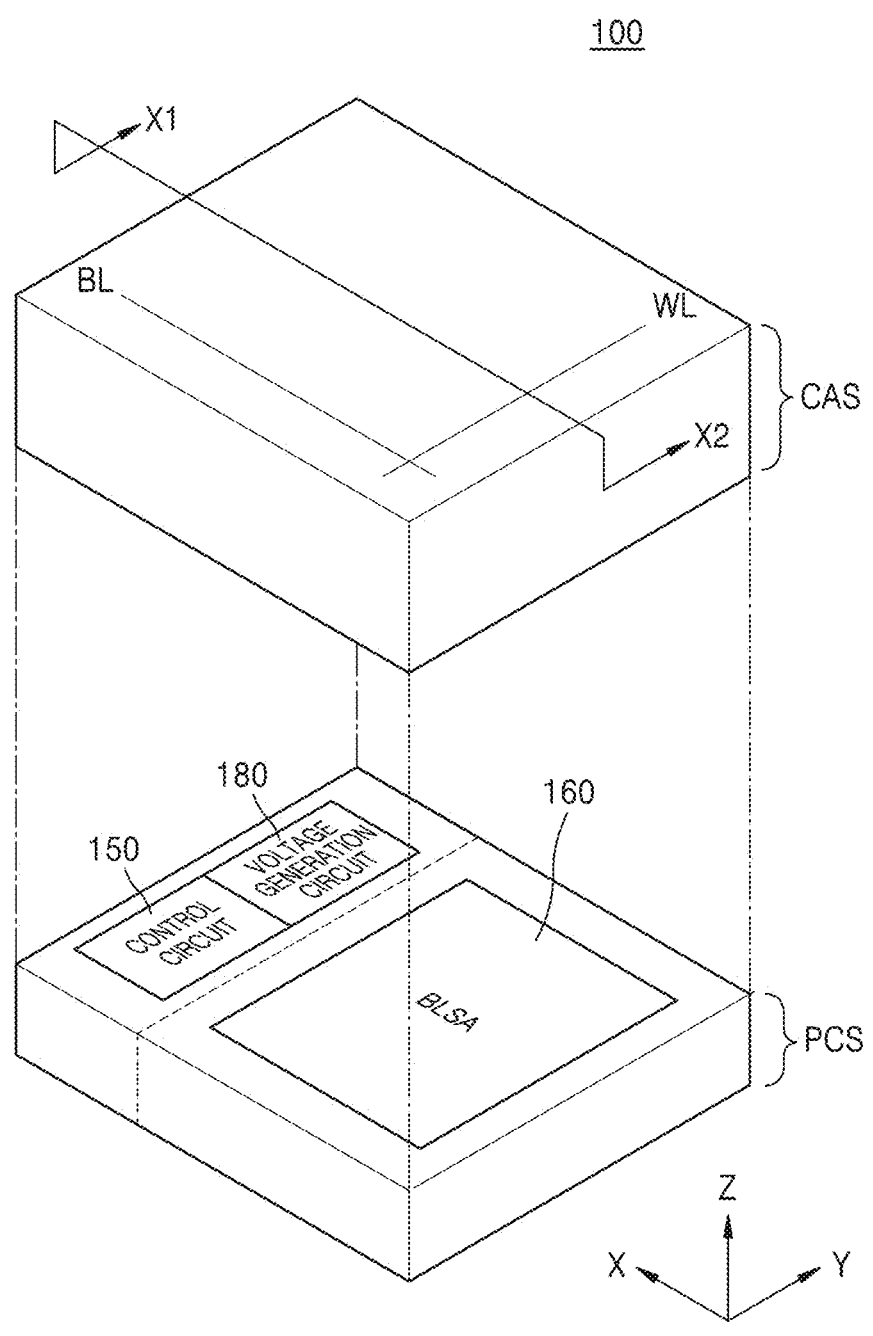
FIGS. 12 and 13 illustrate a structure of a memory device according to embodiments.
Figure 13:
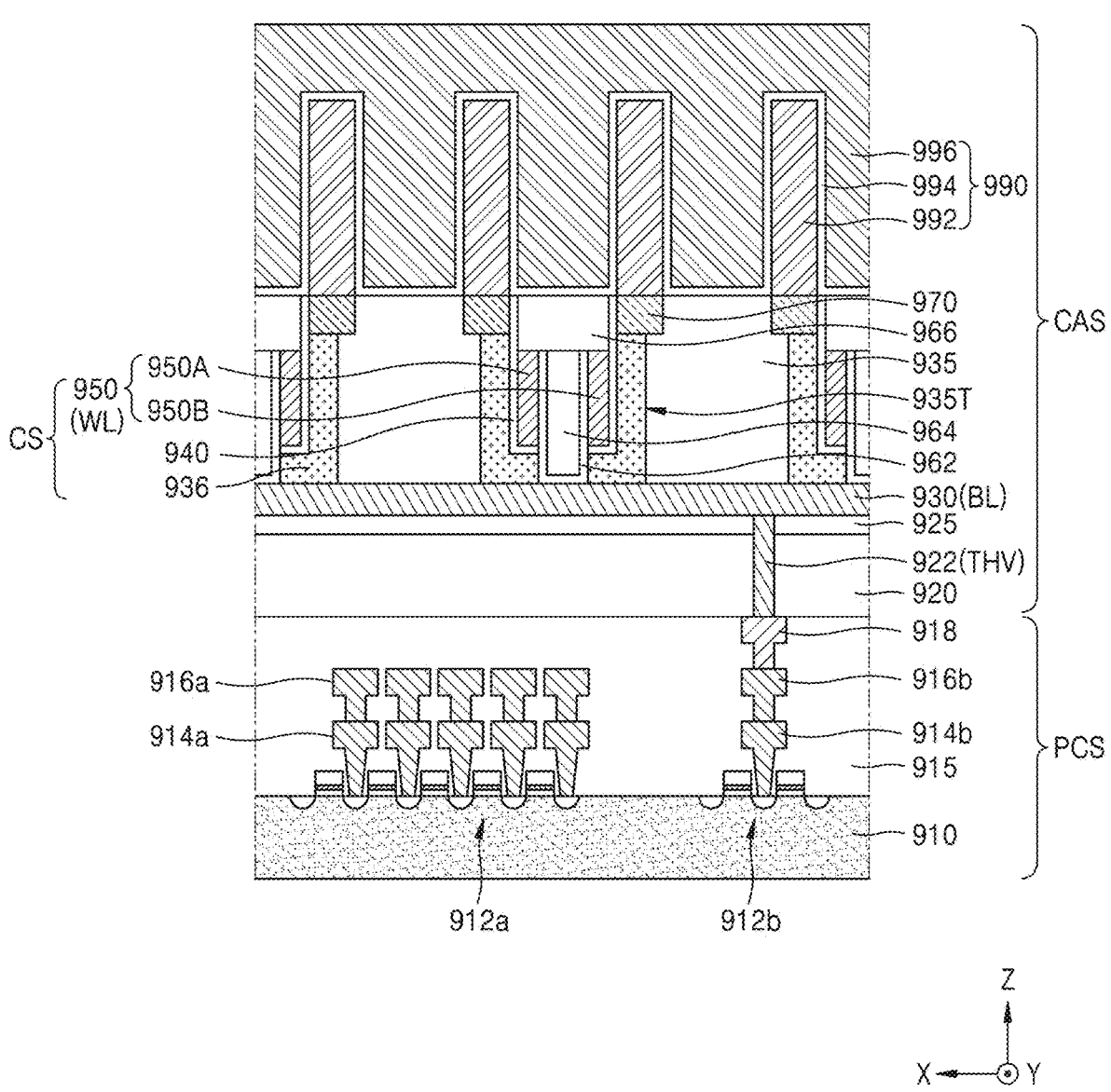

FIGS. 12 and 13 illustrate a structure of the memory device 100 according to embodiments. FIG. 13 is a cross-sectional view taken along line X1-X2 of FIG. 12.

Referring to FIGS. 1 and 12, the memory device 100 may include a cell array structure CAS and a peripheral circuit structure PCS overlapping each other in the vertical direction (the Z direction). The cell array structure CAS may include the memory cell array 110. The peripheral circuit structure PCS may include a peripheral circuit including the command decoder 120, the address buffer 130, the address decoder 140, the control circuit 150, the sense amplifier 160, the data I/O circuit 170, and the voltage generation circuit 180. Accordingly, the memory device 100 may have a structure, i.e., a cell over periphery (COP) structure, in which the memory cell array 110 is disposed on the peripheral circuit.

The cell array structure CAS may include a plurality of memory blocks. Each of the plurality of memory blocks may include a plurality of memory cells each including a vertical channel transistor. In the cell array structure CAS, the plurality of bit lines BL may extend in a first horizontal direction (the X direction) and the plurality of word lines WL may extend in a second horizontal direction (the Y direction).

The peripheral circuit structure PCS may include a semiconductor substrate, and the peripheral circuit may be formed by forming, on the semiconductor substrate, a pattern for wiring semiconductor devices, such as a transistor, and devices. After forming the peripheral circuit in the peripheral circuit structure PCS, the cell array structure CAS including the memory cell array 110 may be formed, and patterns for electrically connecting the plurality of word lines WL and the plurality of bit lines BL of the memory cell array 110 to the peripheral circuit formed in the peripheral circuit structure PCS may be formed. For example, the sense amplifier 160, the control circuit 150, and the voltage generation circuit 180 may be arranged in the peripheral circuit structure PCS.

Referring to FIG. 13, the peripheral circuit structure PCS may include a lower substrate 910, an interlayer insulating layer 915, a plurality of circuit devices, e.g., first and second circuit devices 912a and 912b, formed on the lower substrate 910, first metal layers 914a and 914b respectively connected to the first and second circuit devices 912a and 912b, second metal layers 916a and 916b respectively formed on the first metal layers 914a and 914b, and a metal pattern 918 formed in the top metal layer of the peripheral circuit structure PCS. In an embodiment, the first metal layers 914a and 914b may be formed of tungsten having a relatively high resistance and the second metal layers 916a and 916b may be formed of copper having a relatively low resistance.

Although only the first metal layers 914a and 914b and the second metal layers 916a and 916b are shown and described in the specification, embodiments are not limited thereto, and one or more metal layers may be further formed on the second metal layers 916a and 916b. At least some of the one or more metal layers formed on the second metal layers 916a and 916b may be formed of aluminum or the like having a lower resistance than copper forming the second metal layers 916a and 916b. The interlayer insulating layer 915 may be disposed on the lower substrate 910 so as to cover the first and second circuit devices 912a and 912b, the first metal layers 914a and 914b, and the second metal layers 916a and 916b and may include an insulating material, such as silicon oxide or silicon nitride.

The first and second circuit devices 912a and 912b may be connected to at least one of circuit devices constituting the peripheral circuit. For convenience of description, the first circuit device 912a represents any one of a plurality of transistors in the sense amplifier 160 described with reference to FIG. 3 and the second circuit device 912b represents transistors constituting the control circuit 150 or the voltage generation circuit 180.

The cell array structure CAS may include an upper substrate 920, an interline insulating layer 925, a plurality of conductive lines 930 on the interline insulating layer 925, a through electrode 922 penetrating the interline insulating layer 925 and the upper substrate 920 and beneath a conductive line 930, a cell structure CS on the conductive line 930, and a plurality of capacitor structures 990 on the cell structure CS. The interline insulating layer 925 may be formed to cover the lower surface and the side surfaces of each of the plurality of conductive lines 930 and fill a space between adjacent conductive lines 930. Each of the plurality of conductive lines 930 may extend in the first horizontal direction (the X direction). The plurality of conductive lines 930 may be spaced apart from each other in the second horizontal direction (the Y direction) that is perpendicular to the first horizontal direction (the X direction), and each of the plurality of conductive lines 930 may extend in the first horizontal direction (the X direction). The through electrode 922 may be formed to extend long in the vertical direction (the Z direction) to the metal pattern 918 of the peripheral circuit structure PCS by penetrating the upper substrate 920 and may electrically connect the conductive line 930 to the second circuit device 912b of the sense amplifier 160. The conductive line 930 may function as the bit line BL of the memory device 100.

An isolation insulating layer 935 may be formed on the conductive line 930. The isolation insulating layer 935 may include a channel trench 935T extending long in the first horizontal direction (the X direction), and a plurality of insulating patterns spaced apart from each other by the channel trench 935T may be formed. A channel layer 936 may be formed in the channel trench 935T. The channel layer 936 may extend along the side surfaces and the lower surface of the channel trench 935T, and may be electrically connected to the conductive line 930. A gate dielectric layer 940 may be formed on the channel layer 936 in the channel trench 935T. The gate dielectric layer 940 may be between the channel layer 936 and a gate electrode 950. The gate electrode 950 may be formed on the gate dielectric layer 940 in the channel trench 935T. In some embodiments, the gate electrode 950 may include a first gate electrode 950A and a second gate electrode 950B opposite to each other in one channel trench 935T. In this case, a structure of two transistors per channel layer 936 may be implemented. The first gate electrode 950A may function as a first word line of the memory cell array 110, and the second gate electrode 950B may function as a second word line of the memory cell array 110.

In some embodiments, a barrier insulating layer 962 and a gap-fill insulating layer 964 may be formed between the first gate electrode 950A and the second gate electrode 950B. The first gate electrode 950A and the second gate electrode 950B may be separated from each other by the barrier insulating layer 962 and the gap-fill insulating layer 964. The gap-fill insulating layer 964 may be formed on the barrier insulating layer 962 and fill a region between the first gate electrode 950A and the second gate electrode 950B.

The cell structure CS may include a plurality of vertical channel transistor structures. A vertical channel transistor may be referred to as a structure in which the channel length of the channel layer 936 extends in the vertical direction (the Z direction) that is perpendicular to the upper surface of the upper substrate 920. The vertical channel transistor may include the channel layer 936, the gate electrode 950, and the gate dielectric layer 940 between the channel layer 936 and the first gate electrode 950A. The channel layer 936 of the vertical channel transistor may include a first source/drain region and a second source/drain region disposed in the vertical direction (the Z direction). For example, a lower portion of the channel layer 936 may function as the first source/drain region and an upper portion of the channel layer 936 may function as the second source/drain region. A portion of the channel layer 936 between the first source/drain region and the second source/drain region may function as a channel region.

A contact layer 970 in contact with the upper surface of the channel layer 936 may be formed on the channel layer 936. The contact layer 970 may connect the channel layer 936 to a capacitor structure 990. The upper surface of one channel layer 936 adjacent to the first gate electrode 950A may be in contact with one contact layer 970, and the upper surface of another channel layer 936 adjacent to the second gate electrode 950B may be in contact with another contact layer 970.

The capacitor structure 990 may be formed on the isolation insulating layer 935 and the contact layer 970. The capacitor structure 990 may be in contact with the upper surface of the contact layer 970. The capacitor structure 990 may store data under control by the conductive line 930 and the gate electrode 950. The capacitor structure 990 may include a lower electrode 992, a capacitor dielectric layer 994, and an upper electrode 996. The capacitor structure 990 may store charges in the capacitor dielectric layer 994 by using a potential difference occurring between the lower electrode 992 and the upper electrode 996.

One of the plurality of vertical channel transistor structures and one of the plurality of capacitor structures 990 may constitute a memory cell, and thus, the cell array structure CAS may include a plurality of memory cells including a plurality of cell structures CS and the plurality of capacitor structures 990.

Figure 14:
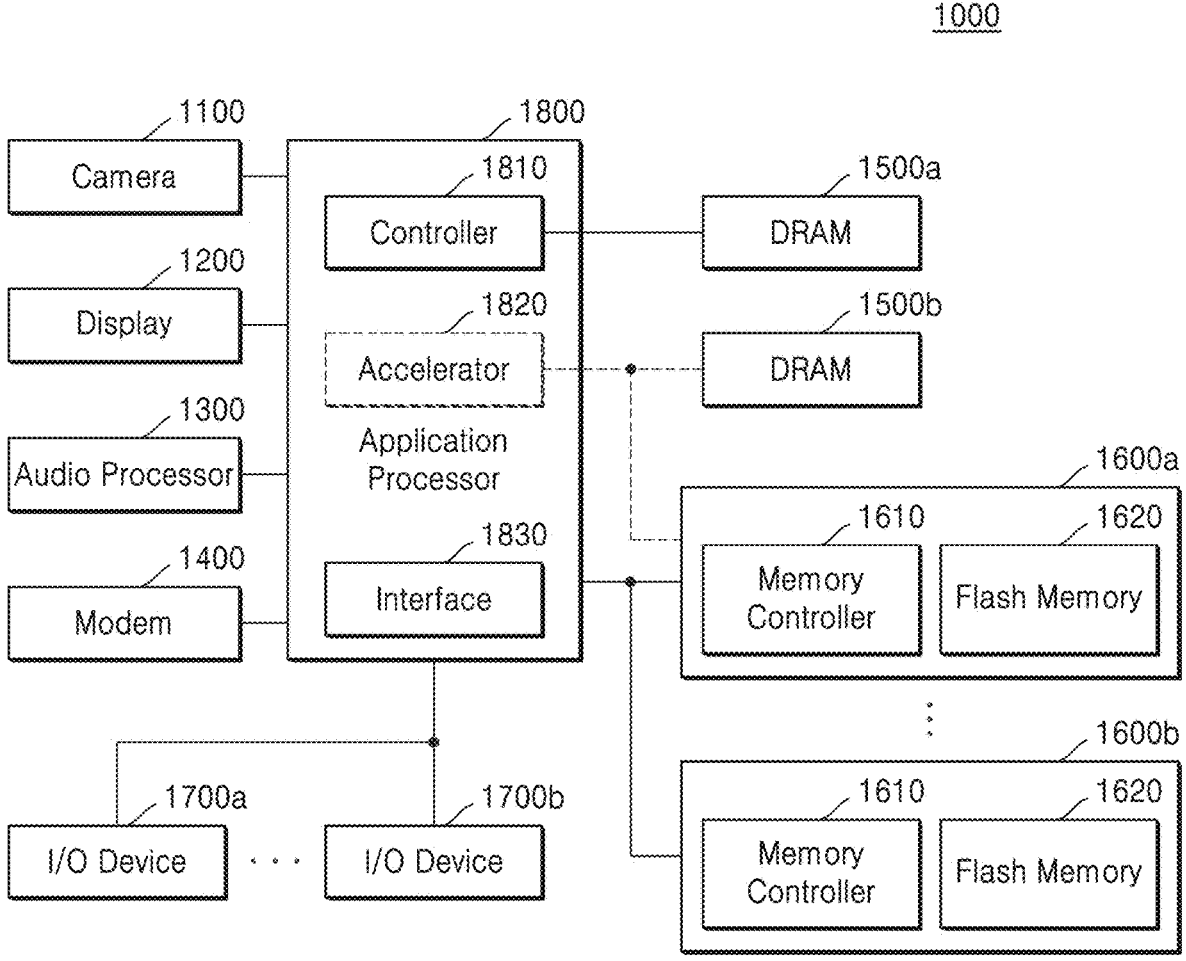
FIG. 14 is a block diagram of a system for describing an electronic device including a memory device according to embodiments.

FIG. 14 is a block diagram of a system 1000 for describing an electronic device including a memory device according to embodiments.

Referring to FIG. 14, the system 1000 may include a camera 1100, a display 1200, an audio processor 1300, a modem 1400, DRAMs 1500a and 1500b, flash memories 1600a and 1600b, I/O devices 1700a and 1700b, and an application processor (AP) 1800. The system 1000 may be implemented by a laptop computer, a mobile phone, a smartphone, a tablet personal computer (PC), a wearable device, a healthcare device, or an Internet of Things (IoT) device. Alternatively, the system 1000 may be implemented by a server or a PC.

The camera 1100 may capture a still image or a video according to control by a user and store the captured image/image data or transmit the captured image/image data to the display 1200. The audio processor 1300 may process audio data included in content of the flash memories 1600a and 1600b or a network. The modem 1400 may modulate and transmit a signal for wired/wireless data transmission and reception, and the modulated signal may be demodulated at a reception side to restore an original signal. The I/O devices 1700a and 1700b may include devices configured to provide a digital input and/or output function, such as a universal serial bus (USB) or storage, a digital camera, a secure digital (SD) card, a digital versatile disc (DVD), a network adaptor, and a touch screen.

The AP 1800 may control a general operation of the system 1000. The AP 1800 may include a control block 1810, an accelerator block or accelerator chip 1820, and an interface block 1830. The AP 1800 may control the display 1200 such that a portion of content stored in the flash memories 1600a and 1600b is displayed on the display 1200. The AP 1800 may perform a control operation corresponding to a user input if the user input is received through the I/O devices 1700a and 1700b. The AP 1800 may include the accelerator chip 1820 that is (or includes) a dedicated circuit for artificial intelligence (AI) data computation, or the accelerator chip 1820 may be provided separately from the AP 1800. The DRAM 1500b may be additionally mounted in the accelerator block or accelerator chip 1820. An accelerator is a function block configured to specially perform a particular function of the AP 1800 and may include a graphics processing unit (GPU) that is a function block configured to specially perform graphics data processing, a neural processing unit (NPU) that is a block configured to specially perform AI computation and inference, and a data processing unit (DPU) that is a block configured to specially perform data transmission.

The system 1000 may include the DRAMs 1500a and 1500b. The AP 1800 may control the DRAMs 1500a and 1500b through a command and mode register set (MRS) according to a Joint Electron Device Engineering Council (JEDEC) standard or perform communication by setting a DRAM interface protocol to use company-specific functions, such as low voltage/high speed/reliability, and a cyclic redundancy check (CRC)/error correction code (ECC) function. For example, the AP 1800 may communicate with the DRAM 1500a through an interface according to a JEDEC standard, such as LPDDR4 or LPDDR5, and the accelerator block or accelerator chip 1820 may perform communication by setting a new DRAM interface protocol to control the DRAM 1500b for an accelerator, which has a higher bandwidth than the DRAM 1500a.

Although FIG. 14 shows only the DRAMs 1500a and 1500b, embodiments are not limited thereto, and only if the bandwidth, the reaction speed, and the voltage conditions of the AP 1800 or the accelerator chip 1820 are satisfied, any one of parameter random access memory (PRAM), static random access memory (SRAM), magnetoresistive random access memory (MRAM), resistive random access memory (RRAM), ferroelectric random access memory (FRAM), hybrid random access memory (RAM), or the like is usable.

The DRAMs 1500*a* and 1500*b* have a relatively less latency and bandwidth than the I/O devices 1700*a* and 1700*b* or the flash memories 1600*a* and 1600*b*. The DRAMs 1500*a* and 1500*b* may be initialized at a power-on time point of the system 1000 and used as a temporary storage of an operating system and application data by loading the operating system and the application data thereon or used as an execution space of various kinds of software codes.

In the DRAMs 1500*a* and 1500*b*, the four fundamental arithmetic operations, such as addition, subtraction, multiplication, and division, a vector computation, an address computation, or a fast Fourier transform (FFT) computation may be performed. In addition, in the DRAMs 1500*a* and 1500*b*, a function used for inference may be performed. Herein, the inference may be performed in a deep learning algorithm using an artificial neural network. The deep learning algorithm may include a training step of training a model through various data and an inference step of recognizing data by using the trained model. In an embodiment, an image captured by a user through the camera 1100 may be signal-processed and stored in the DRAM 1500*b*, and the accelerator block or accelerator chip 1820 may perform AI data computation for recognizing data by using data stored in the DRAM 1500*b* and a function used for inference.

The system 1000 may include a plurality of storages or the flash memories 1600*a* and 1600*b* having a larger capacity than the DRAMs 1500*a* and 1500*b*. The accelerator block or accelerator chip 1820 may perform the training step and the AI data computation by using the flash memories 1600*a* and 1600*b*. In an embodiment, each of the flash memories 1600*a* and 1600*b* may include a memory controller 1610 and a flash memory device 1620, and the training step and the inference AI data computation performed by the AP 1800 and/or the accelerator chip 1820 may be efficiently performed using a computation device included in the memory controller 1610. The flash memories 1600*a* and 1600*b* may store photographs taken through the camera 1100 or store data received over a data network. For example, the flash memories 1600*a* and 1600*b* may store augmented reality/virtual reality, high definition (HD), or ultra high definition (UHD) content.

In the system 1000, the DRAMs 1500*a* and 1500*b* may be a memory device including an offset compensated sense amplifier described with reference to FIGS. 1 to 13. A sense amplifier configured to sense and amplify data stored in a memory cell may include a first sense amplifier circuit including first and second PMOS transistors connected to a first sensing driving signal line and a second sense amplifier circuit including first and second NMOS transistors connected to a second sensing driving signal line. The sense amplifier performs the offset compensation operation to make a threshold voltage difference between a bit line and a complementary bit line before sensing and amplifying the data stored in the memory cell, and the offset compensation operation includes a first offset compensation operation corresponding to the threshold voltage difference of the first and second NMOS transistors and a second offset compensation operation corresponding to the threshold voltage difference of the first and second PMOS transistors. The sense amplifier may sequentially perform the first and second offset compensation operations and then further perform a third offset compensation operation corresponding to the threshold voltage difference of NMOS transistors. Accordingly, the reliability and accuracy of the sense amplifier may be improved and the performance of a memory device may be improved.

In some example embodiments, each of the components represented by a block as illustrated in FIGS. 1, 2, 12 and 14, may be implemented as various numbers of hardware, and/or firmware structures that execute respective functions described above, according to example embodiments. For example, at least one of these components may include various hardware components including a digital circuit, a programmable or non-programmable logic device or array, an application specific integrated circuit (ASIC), transistors, capacitors, logic gates, or other circuitry using a direct circuit structure, such as a memory, a processor, a logic circuit, a look-up table, etc., that is configured to execute the respective functions through controls of one or more microprocessors or other control apparatuses. Also, at least one of these components may further include or may be implemented by a processor such as a central processing unit (CPU) that performs the respective functions, a microprocessor, or the like.

While aspects of embodiments have been particularly shown and described, it will be understood that various changes in form and details may be made therein without departing from the spirit and scope of the following claims.

What is claimed is:

1. A sense amplifier for sensing and amplifying data stored in a memory cell, the sense amplifier comprising:
   a first sense amplifier circuit comprising a first positive-channel metal oxide semiconductor (PMOS) transistor connected between a first sensing driving signal line and an internal node, and a second PMOS transistor connected between the first sensing driving signal line and a complementary internal node;
   a second sense amplifier circuit comprising a first negative-channel metal oxide semiconductor (NMOS) transistor connected between a second sensing driving signal line and a bit line, and a second NMOS transistor connected between the second sensing driving signal line and a complementary bit line;
   an isolation circuit connected between the first sense amplifier circuit and the second sense amplifier circuit, and configured to, according to an isolation signal, selectively connect the internal node to the bit line and selectively connect the complementary internal node to the complementary bit line; and
   an equalization circuit configured to selectively connect the internal node to the complementary internal node according to a bit line equalizing signal and selectively connect an equalizing driving signal line to the complementary internal node according to an equalizing signal,
   wherein the sense amplifier is configured to perform an offset compensation operation before sensing and amplifying the data stored in the memory cell, and
   wherein the offset compensation operation comprises a first offset compensation operation based on a threshold voltage difference between the first NMOS transistor and the second NMOS transistor, and a second offset compensation operation based on a threshold voltage difference between the first PMOS transistor and the second PMOS transistor.

2. The sense amplifier of claim 1, wherein the sense amplifier is further configured to perform the second offset compensation operation after performing the first offset compensation operation,
   wherein the first offset compensation operation comprises:

disconnecting, according to the isolation signal, the internal node from the bit line and the complementary internal node from the complementary bit line;

connecting the internal node to the complementary internal node according to the bit line equalizing signal;

providing an internal power source voltage higher than a first bit line precharge voltage to the first sensing driving signal line and the second sensing driving signal line; and providing the first bit line precharge voltage to the equalizing driving signal line, and wherein the second offset compensation operation comprises disconnecting, according to the bit line equalizing signal, the internal node from the complementary internal node.

3. The sense amplifier of claim 2, wherein the offset compensation operation further comprises a third offset compensation operation based on the threshold voltage difference between the first NMOS transistor and the second NMOS transistor after performing the second offset compensation operation, and wherein the third offset compensation operation comprises:

floating the first sensing driving signal line;

connecting the internal node to the complementary internal node according to the bit line equalizing signal;

connecting the equalizing driving signal line to the complementary internal node according to the equalizing signal; and providing a second bit line precharge voltage higher than the first bit line precharge voltage to the equalizing driving signal line.

4. The sense amplifier of claim 2, wherein the offset compensation operation further comprises a third offset compensation operation based on the threshold voltage difference between the first PMOS transistor and the second PMOS transistor after performing the second offset compensation operation, and wherein the third offset compensation operation comprises connecting the internal node to the complementary internal node according to the bit line equalizing signal.

5. The sense amplifier of claim 1, wherein the sense amplifier is further configured to perform the second offset compensation operation after the first offset compensation operation, wherein the first offset compensation operation comprises:

disconnecting, according to the isolation signal, the internal node from the bit line and the complementary internal node from the complementary bit line;

connecting the internal node to the complementary internal node according to the bit line equalizing signal;

connecting the equalizing driving signal line to the complementary internal node according to the equalizing signal;

providing a second bit line precharge voltage higher than a first bit line precharge voltage to the equalizing driving signal line;

floating the first sensing driving signal line; and providing an internal power source voltage higher than the first bit line precharge voltage to the second sensing driving signal line, and wherein the second offset compensation operation comprises:

disconnecting the internal node from the complementary internal node according to the bit line equalizing signal;

disconnecting the equalizing driving signal line from the complementary internal node according to the equalizing signal;

providing the internal power source voltage to the first sensing driving signal line; and providing the first bit line precharge voltage to the equalizing driving signal line.

6. The sense amplifier of claim 5, wherein the offset compensation operation further comprises a third offset compensation operation based on the threshold voltage difference between the first NMOS transistor and the second NMOS transistor after performing the second offset compensation operation, and during the third offset compensation operation, the internal node is connected to the complementary internal node according to the bit line equalizing signal.

7. The sense amplifier of claim 5, wherein the offset compensation operation further comprises a third offset compensation operation based on the threshold voltage difference between the first NMOS transistor and the second NMOS transistor after performing the second offset compensation operation, and wherein the third offset compensation operation comprises:

floating the first sensing driving signal line;

connecting the internal node to the complementary internal node according to the bit line equalizing signal;

connecting the equalizing driving signal line to the complementary internal node according to the equalizing signal; and providing the second bit line precharge voltage to the equalizing driving signal line.

8. The sense amplifier of claim 1, wherein the sense amplifier is further configured to perform a charge sharing operation based on charges stored in the memory cell after performing the offset compensation operation, and wherein the charge sharing operation comprises:

disconnecting, according to the isolation signal, the internal node from the bit line and the complementary internal node from the complementary bit line;

connecting the internal node to the complementary internal node according to the bit line equalizing signal, floating the first sensing driving signal line and the second sensing driving signal line;

connecting the equalizing driving signal line to the complementary internal node according to the equalizing signal, and providing a third bit line precharge voltage lower than a first bit line precharge voltage to the equalizing driving signal line.

9. The sense amplifier of claim 8, wherein the sense amplifier is further configured to perform a sensing operation based on voltage levels of the bit line and the complementary bit line after performing the charge sharing operation, and wherein the sensing operation comprises:

disconnecting the internal node from the complementary internal node according to the bit line equalizing signal;

disconnecting the equalizing driving signal line from the complementary internal node according to the equalizing signal;

providing an internal power source voltage to the first sensing driving signal line;

providing a ground voltage to the second sensing driving signal line; and connecting, according to the isolation signal, the internal node to the bit line and the complementary internal node to the complementary bit line.

10. A method of operating a memory device to sense and amplify data stored in a memory cell, the method comprising:

generating a first bit line precharge voltage, a second bit line precharge voltage higher than the first bit line precharge voltage, a third bit line precharge voltage lower than the first bit line precharge voltage, a first internal power source voltage, and a second internal power source voltage different from the first internal power source voltage by using a power source voltage of the memory device;

providing an isolation signal, a bit line equalizing signal, and an equalizing signal to a sense amplifier based on a command received by the memory device, the sense amplifier comprising a first sense amplifier circuit which comprises a first positive-channel metal oxide semiconductor (PMOS) and a second PMOS transistor connected to a first sensing driving signal line, and a second sense amplifier circuit which comprises a first negative-channel metal oxide semiconductor (NMOS) transistor and a second NMOS transistor connected to a second sensing driving signal line;

performing an offset compensation operation using the first internal power source voltage to control a threshold voltage difference between a bit line and a complementary bit line, the offset compensation operation comprising a first offset compensation operation based on a threshold voltage difference between the first NMOS transistor and the second NMOS transistor, and a second offset compensation operation based on a threshold voltage difference between the first PMOS transistor and the second PMOS transistor;

performing a charge sharing operation based on charges stored in the memory cell while controlling the first sensing driving signal line and the second sensing driving signal line to float after performing the offset compensation operation; and performing a sensing operation based on voltage levels of the bit line and the complementary bit line while providing the second internal power source voltage to the first sensing driving signal line and a ground voltage to the second sensing driving signal line, after performing the charge sharing operation.

11. The method of claim 10, wherein the first PMOS transistor is provided in the first sense amplifier circuit and is connected between the first sensing driving signal line and an internal node, and wherein the second PMOS transistor is provided in the first sense amplifier circuit and is connected between the first sensing driving signal line and a complementary internal node, wherein the first NMOS transistor is provided in the second sense amplifier circuit and is connected between the second sensing driving signal line and the bit line, wherein the second NMOS transistor is provided in the second sense amplifier circuit and is connected between the second sensing driving signal line and the complementary bit line, and wherein the sense amplifier further comprises:

an isolation circuit connected between the first sense amplifier circuit and the second sense amplifier circuit; and an equalization circuit, and wherein the method further comprises:

controlling, according to the isolation signal, the isolation circuit to selectively connect the internal node to the bit line and the complementary internal node to the complementary bit line;

controlling the equalization circuit to selectively connect the internal node to the complementary internal node according to the bit line equalizing signal; and controlling the equalization circuit to selectively connect an equalizing driving signal line to the complementary internal node according to the equalizing signal.

12. The method of claim 11, wherein the second offset compensation operation is performed after performing the first offset compensation operation, wherein the first offset compensation operation comprises:

disconnecting, according to the isolation signal, the internal node from the bit line and the complementary internal node from the complementary bit line;

connecting the internal node to the complementary internal node according to the bit line equalizing signal;

providing the first internal power source voltage to the first sensing driving signal line and the second sensing driving signal line; and providing the first bit line precharge voltage to the equalizing driving signal line, and wherein the second offset compensation operation comprises disconnecting the internal node from the complementary internal node according to the bit line equalizing signal.

13. The method of claim 12, wherein the offset compensation operation further comprises a third offset compensation operation based on the threshold voltage difference between the first NMOS transistor and the second NMOS transistor that is performed after the second offset compensation operation, and wherein the third offset compensation operation comprises:

floating the first sensing driving signal line;

connecting the internal node to the complementary internal node according to the bit line equalizing signal;

connecting the equalizing driving signal line to the complementary internal node according the equalizing signal; and providing the second bit line precharge voltage to the equalizing driving signal line.

14. The method of claim 12, wherein the offset compensation operation further comprises a third offset compensation operation based on the threshold voltage difference between the first NMOS transistor and the second NMOS transistor that is performed after the second offset compensation operation, and wherein the third offset compensation operation comprises connecting the internal node to the complementary internal node according to the bit line equalizing signal.

15. The method of claim 11, wherein the offset compensation operation comprises performing the second offset compensation operation after performing the first offset compensation operation, wherein the first offset compensation operation comprises:

disconnecting, according to the isolation signal, the internal node from the bit line and the complementary internal node from the complementary bit line;

connecting the internal node to the complementary internal node according to the bit line equalizing signal;

connecting the equalizing driving signal line to the complementary internal node according to the equalizing signal;

providing the second bit line precharge voltage higher than the first bit line precharge voltage to the equalizing driving signal line;

floating the first sensing driving signal line; and providing the first internal power source voltage higher than the first bit line precharge voltage to the second sensing driving signal line, and wherein the second offset compensation operation comprises:

disconnecting the internal node from the complementary internal node according to the bit line equalizing signal;

disconnecting the equalizing driving signal line from the complementary internal node according to the equalizing signal;

providing the second internal power source voltage to the first sensing driving signal line; and providing the first bit line precharge voltage to the equalizing driving signal line.

16. The method of claim 15, wherein the offset compensation operation comprises performing a third offset compensation operation based on the threshold voltage difference between the first NMOS transistor and the second NMOS transistor after performing the second offset compensation operation, and wherein the third offset compensation operation comprises connecting the internal node to the complementary internal node according to the bit line equalizing signal.

17. The method of claim 15, wherein further comprising performing a third offset compensation operation based on the threshold voltage difference between the first NMOS transistor and the second NMOS transistor after performing the second offset compensation operation, and wherein the third offset compensation operation comprises:

floating the first sensing driving signal line;

connecting the internal node to the complementary internal node according to the bit line equalizing signal;

connecting the equalizing driving signal line to the complementary internal node according to the equalizing signal; and providing the second bit line precharge voltage to the equalizing driving signal line.

18. A memory device comprising:

a sense amplifier configured to sense and amplify data stored in a memory cell;

a voltage generation circuit configured to generate a first bit line precharge voltage, a second bit line precharge voltage higher than the first bit line precharge voltage, and an internal power source voltage by using a power source voltage of the memory device; and a control circuit configured to generate an isolation signal, a bit line equalizing signal, and an equalizing signal based on a command received by the memory device, and selectively provide the first bit line precharge voltage, the second bit line precharge voltage and the internal power source voltage to the sense amplifier, wherein the sense amplifier comprises:

a first sense amplifier circuit comprising a first positive-channel metal oxide semiconductor (PMOS) transistor connected between a first sensing driving signal line and an internal node, and a second PMOS transistor connected between the first sensing driving signal line and a complementary internal node;

a second sense amplifier circuit comprising a first negative-channel metal oxide semiconductor (NMOS) transistor connected between a second sensing driving signal line and a bit line and a second NMOS transistor connected between the second sensing driving signal line and a complementary bit line;

an isolation circuit connected between the first sense amplifier circuit and the second sense amplifier circuit and configured to, according to the isolation signal, selectively connect the internal node to the bit line and selectively connect the complementary internal node to the complementary bit line; and an equalization circuit configured to selectively connect the internal node to the complementary internal node according to the bit line equalizing signal and selectively connect an equalizing driving signal line to the complementary internal node according to the equalizing signal, and wherein the sense amplifier is configured to perform an offset compensation operation before sensing and amplifying the data stored in the memory cell, and the offset compensation operation is performed such that a threshold voltage difference occurs between the bit line and the complementary bit line, and comprises a first offset compensation operation a threshold voltage difference between the first NMOS transistor and the second NMOS transistor, and a second offset compensation operation based on a threshold voltage difference between the first PMOS transistor and the second PMOS transistor.

19. The memory device of claim 18, wherein the sense amplifier is further configured to perform the second offset compensation operation after performing the first offset compensation operation, wherein the offset compensation operation further comprises a third offset compensation operation based on the threshold voltage difference between the first NMOS transistor and the second NMOS transistor that is performed after the second offset compensation operation, wherein the first offset compensation operation comprises:

disconnecting, according to the isolation signal, the internal node from the bit line and the complementary internal node from the complementary bit line;

connecting the internal node to the complementary internal node according to the bit line equalizing signal;

providing the internal power source voltage to the first
sensing driving signal line and the second sensing
driving signal line; and
providing the first bit line precharge voltage to the
equalizing driving signal line;
wherein the second offset compensation operation com-
prises disconnecting the internal node from the comple-
mentary internal node according to the bit line equal-
izing signal, and
wherein the third offset compensation operation com-
prises:
floating the first sensing driving signal line;
connecting the internal node to the complementary
internal node according to the bit line equalizing
signal;
connecting the equalizing driving signal line to the
complementary internal node according to the equal-
izing signal; and
providing the second bit line precharge voltage to the
equalizing driving signal line.
20. The memory device of claim 18, wherein the sense
amplifier is further configured to perform the second offset
compensation operation after the first offset compensation
operation
wherein the offset compensation operation further com-
prises a third offset compensation operation based on
the threshold voltage difference between the first
NMOS transistor and the second NMOS transistor that
is performed after the second offset compensation
operation,
wherein the first offset compensation operation com-
prises:

28 disconnecting, according to the isolation signal, the
internal node from the bit line and the complemen-
tary internal node from the complementary bit line;
connecting the internal node to the complementary
internal node according to the bit line equalizing
signal;
connecting the equalizing driving signal line to the
complementary internal node according to the equal-
izing signal;
providing the second bit line precharge voltage to the
equalizing driving signal line;
floating the first sensing driving signal line; and
providing the internal power source voltage to the
second sensing driving signal line,
wherein the second offset compensation operation com-
prises:
disconnecting the internal node from the complemen-
tary internal node according to the bit line equalizing
signal;
disconnecting the equalizing driving signal line from
the complementary internal node according to the
equalizing signal;
providing the internal power source voltage to the first
sensing driving signal line; and
providing the first bit line precharge voltage to the
equalizing driving signal line, and
wherein the third offset compensation operation com-
prises connecting the internal node to the complemen-
tary internal node according to the bit line equalizing
signal.

* * * * *